(12) United States Patent
Hamberg et al.

(10) Patent No.: US 7,352,612 B2
(45) Date of Patent: Apr. 1, 2008

(54) METHOD FOR OPERATING A DATA STORAGE APPARATUS EMPLOYING PASSIVE MATRIX ADDRESSING

(75) Inventors: Per Hamberg, Kisa (SE); Christer Karlsson, Linköping (SE); Per-Erik Nordal, Asker (NO); Nicklas Ojakangas, Linköping (SE); Johan Carlsson, Linköping (SE); Hans Gude Gudesen, Brussels (BE)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 10/579,968

(22) PCT Filed: Nov. 24, 2004

(86) PCT No.: PCT/NO2004/000361

§ 371 (c)(1), (2), (4) Date: Jan. 22, 2007

(87) PCT Pub. No.: WO2005/050657

PCT Pub. Date: Jun. 2, 2005

(65) Prior Publication Data

US 2007/0103960 A1    May 10, 2007

(30) Foreign Application Priority Data

Nov. 24, 2003  (NO) .................................. 20035225

(51) Int. Cl.
*G11C 11/22* (2006.01)
(52) U.S. Cl. .................. 365/158; 365/145; 365/230.03
(58) Field of Classification Search .................. 365/65
See application file for complete search history.

(56) References Cited

U.S. PATENT DOCUMENTS

| | | | |
|---|---|---|---|
| 6,982,895 B2* | 1/2006 | Broms et al. | 365/145 |
| 7,215,565 B2* | 5/2007 | Karlsson et al. | 365/145 |
| 2003/0137865 A1* | 7/2003 | Thompson et al. | 365/145 |
| 2004/0062070 A1 | 4/2004 | Coulson et al. | |

FOREIGN PATENT DOCUMENTS

| WO | WO-02/05287 A1 | 1/2002 |
|---|---|---|
| WO | WO-03/046923 A1 | 6/2003 |

* cited by examiner

*Primary Examiner*—Tan T. Nguyen
(74) *Attorney, Agent, or Firm*—Birch, Stewart, Kolasch & Birch, LLP

(57) ABSTRACT

In a method for reducing detrimental phenomena related to disturb voltages in a data storage apparatus employing passive matrix addressing, particularly a memory device or a sensor device, an application of electric potentials conforming to an addressing operation is generally controlled in a time-coordinated manner according to a voltage pulse protocol. In an addressing operation a data storage cell is set to a first polarization state by means of a first active voltage pulse and then, dependent on the voltage pulse protocol, a second voltage pulse which may be a second active voltage pulse of opposite polarity to that of the first voltage pulse, is applied and used for switching the data storage cell to a second polarization state. The addressed cell is thus set to a predetermined polarization state as specified by the addressing operation. The data storage cells of the apparatus are provided in two or more electrically separated segments such that each segment comprises a separate physical address space for the apparatus. In an addressing operation the data are directed to a segment that is selected based on information on prior and/or scheduled applications of active voltage pulses to the segments.

36 Claims, 26 Drawing Sheets

(PRIOR ART)

(PRIOR ART)

(PRIOR ART)  (PRIOR ART)

(PRIOR ART)

BIT LINE OF CELL TO BE LOGIC '0'

BIT LINE OF CELL TO BE LOGIC '1'

DATA WORD ON ADDRESSED WORD LINE AFTER EXECUTION OF OPERATION (PRIOR ART)

| PHYSICAL ADDRESS | 'PRE-SET' MARK | 'PRE-SET POLARIZATION A' MARK | SEGMENT REFERENCE |
|---|---|---|---|
| | | | |

| SEGMENT REFERENCE | NUMBER OF PRE-SET CELL ADDRESSES | TIMESTAMP OF LAST SEGMENT ACCESS | 'LOCK STATE' MARK | | |
|---|---|---|---|---|---|
| | | | | PHYSICAL ADDRESS ADX | 'PRE-SET POLARIZATION A' MARK |
| | | | | PHYSICAL ADDRESS ADY | 'PRE-SET POLARIZATION A' MARK |

METHOD FOR OPERATING A DATA STORAGE APPARATUS EMPLOYING PASSIVE MATRIX ADDRESSING

FIELD OF THE INVENTION

The present invention concerns methods for reducing detrimental phenomena related to disturb voltages in a data storage apparatus employing passive matrix addressing according to the introduction of claim 1, wherein the data storage cells of the data storage apparatus are provided in two or more electrically separated segments, each segment comprising a separate physical address space of the data storage apparatus.

DESCRIPTION OF THE RELATED PRIOR ART

The relevant configuration as described above is well known in the prior art, and is typically referred to as a passive matrix-addressable memory. As shown in FIG. 1, it is typically implemented by letting two sets of parallel electrodes cross each other, normally in an orthogonal fashion, in order to create a matrix of cross-points that can be individually accessed electrically by selective excitation of the appropriate electrodes from the edge of the matrix. In the following, the horizontal and vertical electrodes in FIG. 1 shall be referred to as "word lines" and "bit lines", respectively. A layer of ferroelectric or electret material is provided between or at the electrode sets such that capacitor-like structures, functioning as memory cells, are formed in the material between or at the crossings of the electrodes. When applying potential differences between two electrodes, the ferroelectric or electret material in the cell is subjected to an electric field that generates a polarization response generally tracing a hysteresis curve or a portion thereof. By manipulating the direction and the magnitude of the electric field, the memory cell can be left in a desired logic state. Passive addressing of this type leads to simplicity of manufacture and a high density of memory cells compared to active addressing wherein active elements such as transistors are used to disconnect a memory cell from the rest of the matrix when appropriate.

The use of ferroelectrics or electrets as memory materials confers non-volatility upon the memory devices in question, due to their ability to retain a logic state in the absence of applied voltages or currents to the memory device. This attribute of ferroelectrics in particular is known and attempts have been made to exploit it in prior art memory devices. It is based on the fact that these electrically polarizable materials possess at least two equilibrium orientations of the spontaneous polarization vector in absence of an external electrical field. The spontaneous polarization vector may be switched between these two orientations by an electric field. One of the polarization states is considered to be a logic "1" and the other state a logic "0". Referring to FIG. 2, a material with a hysteresis loop (210) changes its polarization direction upon application of an electric field that exceeds the coercive field $E_C$ (corresponding to $V_C$ as the hysteresis loop is shown with the voltage rather than the field along the abscissa axis for reasons of convenience). A saturation polarization $P_S$ is obtained when a memory cell is subjected to the nominal switching voltage $V_S$. As the applied voltage is reduced to zero, the polarization will follow the hysteresis curve and end up at the remanent polarization value $P_R$. Depending on the polarity of the applied voltage, this zero field point may be at either of the polarization states marked "1" or "0" in the figure, representing the two different polarization directions and accessible logic states of the cell. Which polarization state being interpreted as a '0' or '1' is in practice only a matter of definition and hence may as well the more generic denominations "polarization state A" and "polarization state B" be used to name the two opposite polarization states.

The amount and type of stimulus subjected to a memory cell in a passive matrix-addressable device depends on how the voltages are managed on word lines and bit lines in the matrix. The time-coordinated control of voltages, or electric potentials, on word lines and bit lines, sometimes called the "timing diagram" or the "voltage pulse protocol" or simply the "pulse protocol", is an important part in the usage of any passive matrix addressable device. The pulse protocol translates operations that may be used in the passive matrix-addressable device into electrode voltages such that the cells addressed by the operation receive the appropriate stimulus.

An addressing operation used on a memory generally consists of at least a command and an address, e.g. READ (address) or WRITE (data, address). Executing an addressing operation consequently corresponds to executing a command on an address. Memory cells addressed by an operation are the cells targeted when executing the addressing operation.

Pulse protocols of particular interest for the present invention define voltages on word and bit lines such that a voltage pulse of $+V_S$ or $-V_S$, henceforth termed an "active voltage pulse" or simply "active pulse", is applied to the memory cell(s) addressed by the operation. In addition to this, the pulse protocols have to assure that any cell not-being addressed, i.e. a "non-addressed" cell also known as "unaddressed" cell, never is subjected to a voltage causing the cell to switch polarization state, typically meaning that the pulse protocol has to make sure that that voltages across non-addressed cells always is less than the coercive voltage $V_C$.

If non-addressed cells always should be subjected to voltages less than $V_C$, active pulses of $-V_S$ and $+V_S$ cannot at the same time be applied to addressed cells in a passive matrix, i.e. it is not possible to concurrently switch memory cells to opposite polarization states. For this reason, an addressing operation may be described to work according to the following generic principle:

First a single polarity active pulse is subjected to each of the addressed cells, setting those cells to a first polarization state which corresponds to one of the two remanent polarization states in FIG. 2. (In case the addressing operation is a read operation, charges are typically sensed on the corresponding bit line during application of the first active voltage pulse.)

After application of the first active voltage pulse, a second active voltage pulse of opposite polarity to the first voltage pulse is optionally applied to a subset of the addressed cells such that the cells in the subset are switched to the second polarization state, resulting in that the addressed cells have been brought to correspond to a value predetermined by the operation. (In the case of a read operation the value is typically the same as before executing the read operation.) The voltage applied over the addressed cells that are not belonging to the subset, should be non-switching, for example $V_S/3$.

FIG. 3 illustrates the above-described generic principle using a pulse protocol disclosed in the present applicant's International published application WO02/05287, which provides a background on the theory of voltage pulse protocols and their use. The alternative option to applying an active voltage pulse after the first active voltage pulse is illustrated by the dashed line for the second voltage pulse in FIG. 3, i.e. the alternative option to applying an active voltage pulse as the second pulse is to apply a non-switching pulse, here shown as a non-switching $V_S/3$ voltage pulse.

FIG. 4a illustrates the same generic principle but using a flowchart. FIGS. 4b and 4c shows that the generic description in FIG. 4a is common for both what here is referred to as an "ordinary write operation" and an "ordinary read operation", which are presented in FIGS. 4b and 4c respectively. In FIG. 4b there is an ordinary write operation where first an active voltage pulse is applied in step 403 to each of the addressed cells, erasing any previous data and setting all addressed cells to one and the same polarization state, then in step 404 a second voltage pulse is applied such that only selected cells get a second active voltage pulse applied resulting in that new data become written to the addressed cells according to what is predetermined by the write operation.

In FIG. 4c there is an ordinary read operation involving a first destructive step 405 wherein a first active voltage pulse is applied to each of the addressed cells while sensing charges in a destructive readout, and a consecutive step 406 where a second voltage pulse is applied to each addressed cell such that a second active voltage pulse of opposite polarity to the first one is applied to some of the memory cells typically such that the original data are rewritten.

The first step 405 in an ordinary read operation and the first step 403 in an ordinary write operation is essentially the same even though pulse lengths, i.e. the time during which the active voltage pulse is being applied, may differ. The duration of a read operation may for example be longer since charges have to be sensed in a confident way. Pulse lengths of interest for the present invention typically are in the range of 0.1 µs-1 ms.

In a passive matrix-addressable device, an arbitrary bit line electrode is common for all word lines and an arbitrary word line electrode is common for all bit lines, which implies that unaddressed cells may get affected when addressing and applying active voltage pulses to addressed cells as for example shown in FIG. 3. In an ideal situation, typically all cells that are not subjected to an active voltage pulse should be subjected to zero voltage, but due to the nature of passive matrices this is not fully possible even though a carefully designed voltage pulse protocol is used. Unwanted voltage pulses occurring in a passive matrix, typically formed on non-addressed cells, are normally referred to as "disturb voltages", "disturb voltage pulses" or simply "disturb pulses". This phenomenon in general, often named "disturb", is an inevitable side effect in all known pulse protocols for passive matrices, at least where it is necessary to write different values to individual cells addressed in an operation. International published application WO03/046923 discloses a full row addressing pulse protocol that does not result in disturb voltages during application of the first active voltage pulse. Further it is shown that, with the exception of certain specialized cases, the minimum voltage across any non-addressed cell is $V_S/3$ when voltage pulses of magnitude $V_S$ are applied to addressed cells elsewhere in the matrix. It is advantageous in passive matrix-addressable devices to address a whole row of memory cells at the same time, typically all memory cells along a word line, in what usually is termed "full row addressing" or "full word addressing". However, it is also possible with so called "partial word addressing". The location of data belonging to a word address in a passive matrix-addressable memory is illustrated in FIG. 5.

To further explain the relation between cell voltages and electric potentials at word lines and bit lines, and to illustrate the origin of disturb voltages, FIGS. 6 and 7 will be used to show examples of possible management of electrode potentials when addressing a word line such that voltage pulses are applied to addressed cells according to the previous example in FIG. 3.

FIG. 6 shows the denominations used for electrode potentials during execution of a full row addressing operation: "addressed word line" is the word addressed by the operation; "unaddressed word line" refers to all other word lines except the addressed word line; "bit line set to logic 1" refers to all bit lines which are intersecting the addressed word line at memory cells to be interpreted as '1' after the operation; and "bit line set to logic 0" refers to all bit lines that are intersecting the addressed word line at memory cells to be interpreted as '0' after the operation.

FIG. 7a shows one example of possible selections of electric potentials on the electrodes to generate a potential difference resulting in the first active voltage pulse $-V_S$ in FIG. 3. Note that all addressed cells in FIG. 3 will be set to the same polarization state, in this example corresponding to '0', and that there is no potential difference over unaddressed cells, i.e. no disturb voltages in the example. FIG. 7b gives an example of possible selections of electric potentials to achieve a so called "quiescent state" where there are no potential differences over the cells, as for example is the case between the pulses shown in FIG. 3. FIG. 7c shows example of possible selections of electric potentials on the electrodes to accomplish potential difference resulting in the second voltage pulse, in FIG. 3, i.e. a second active voltage pulse of $+V_S$ or the dashed $V_S/3$ disturb pulse. Note that only addressed cells that are to be switched to logic '1' are subjected to the active voltage pulse of Vs while those to remain logic '0', as set in FIG. 7a, are exposed to a non-switching $+V_S/3$ potential difference, which is an example of an unwanted disturb. During application of the second voltage pulse, disturb voltages of $+V_S/3$ and $-V_S/3$ are as well present across cells along the unaddressed word lines. The polarity of a disturb pulse at an unaddressed word line depends on if there is an active voltage pulse applied or not for the addressed cell at the bit line intersecting the unaddressed word line. By studying the potentials in FIG. 7c it is revealed that whatever the potential selections of the electrodes are, there will always be disturb voltages present somewhere, at least when it is desired to concurrently apply an active voltage pulse to some but not all of the addressed cells.

Disturb voltages in combination with certain properties related to polarizable materials introduce some particular problems to be dealt with. A disturb voltage that is below $V_C$ may for example partially switch a memory cell in the direction given by the polarity of the disturb pulse, thus reducing the net polarization in the cell. In combination with the phenomenon of "imprint" a disturb pulse may even, under certain circumstances, result in an accidental switch of polarization in a non-addressed cell. Imprint may arise in memory cells that remain in a certain polarization state for a period of time. It manifests itself as a change in the switching properties whereby the hysteresis curve shifts so as to increase the coercive field perceived when switching the polarization direction to that opposite to the direction where the material has resided during the imprinting period. In other words, the polarization has a tendency to become stuck in the direction where it has been allowed to rest for some time. If an active pulse is applied to switch an imprinted cell, that cell may for a period of time be sensitive to even small voltages in the former imprint direction, e.g. a disturb pulse. If the imprinted cell does not get time to settle in the new direction, such a disturb pulse may accidentally switch the cell back in the imprint direction.

Not only may a disturb pulse accidentally switch a memory cell, disturb voltages also cause so called "sneak" currents which for example may mask charges to be sensed when reading an addressed cell. The problem of disturb, in particular for the sneak current case, is aggravated in large passive matrix structures with many disturbed memory cells per addressed cell. Another related problem is relaxation currents, i.e. currents remaining in the matrix after the application of a voltage pulse and that decay relatively slowly compared to the direct charge release e.g. from applying an active voltage pulse to a cell. Relaxation currents may linger and interfere with consecutive operations and it is therefore often required to design regular wait-intervals between operations to assure a sufficient decay of the relaxation currents, which in turn results in the negative side effect of reduced data rate, e.g. in reading and writing.

It is often desirable, or even required, to internally divide the passive matrix structure into smaller "sub-matrices" or "segments", for instance to reduce power requirements or to reduce the number of disturbed cells during addressing. Segmentation may be accomplished in various ways, and for instance be partial as disclosed in the present applicant's international published application W02/25665, which in a preferred embodiment teaches the use of electrically segmented word lines in passive matrix-addressable ferroelectric memories.

A sub-matrix or a segment may to some extent be seen as a passive matrix of its own, even though common means often are shared between segments, like for example a substrate, sense amplifiers, multiplexers, drivers etc. It may even be possible to consider two substantially independent passive matrix devices as segments if they are part of the same memory address area and operated as a single larger memory. There is no unambiguous definition of a segmented passive matrix, or sub-matrix, hence there is a need to define what types of segmented passive matrices that are of special concern for the present invention, viz. such that comply with the following two requirements:

An addressing operation on a cell in a segment shall only cause substantial disturb voltages in the same segment.

It shall be possible to uniquely address a specific address in a specific segment.

FIG. 8 illustrates the absence of Vs/3 disturb for a non-addressed cell belonging to another segment than the addressed cell.

Another phenomenon that may affect polarizable materials is "fatigue", which results from repeated switching of the direction of polarization in a given memory cell, whereby the remanent polarization progressively diminishes and ultimately becomes too small to allow proper operation of the memory. This phenomenon is well known and a range of remedies exists in the prior art. Nevertheless, there is typically an upper limit to the number of switches that a polarizable material in a memory cell can handle before becoming fatigued. In a device that during its lifetime has a theoretical possibility to reach the domain of that upper limit, there is a risk of certain cells at certain addresses in the memory device maybe subjected to more switches than the other cells, causing the memory or part of the memory to become useless in a shorter time than would have been the case if switching were evenly distributed amongst all the cells.

SUMMARY OF THE INVENTION

Even though some prior art segmentation reduces the total disturb and a well designed pulse protocol in the prior art may keep disturb voltages at a low level, there are still disturb voltages present within each segment, something which in combination with the imprint phenomenon and due to occurrence of sneak and relaxation currents, makes it necessary to decrease the data rate of the memory device to assure delays between operations and active voltage pulses such that sneak and relaxation currents may decline and switched cells will get time to settle.

The principal object of the invention is to increase the possible data rate by remedying the above-mentioned problems.

Another object of the present invention is to distribute addressing operations such that the lifetime restricted by fatigue increases.

The above objects as well as further advantages and features are realized with a method according to the invention comprising setting in a first addressing operation constituting a first part of an addressing cycle one or more addressed data storage cells in one of the segments to a first polarization state by means of a first active voltage pulse in the first addressing operation, during which each bit line dependent on the voltage pulse protocol can be connected with a sensing means for detecting the polarization state of the data storage cell at least under a part of the duration of the first active voltage pulse: applying to the one or more addressed data storage cells in the one segment dependent on the voltage pulse protocol a second voltage pulse which can be a second active voltage pulse of opposite polarity to that of the first active voltage pulse and switching the addressed data storage cell from the first polarization state to a second polarization state, such that each cell being addressed is set to a predetermined polarization state as specified by the first addressing operation; applying in a second addressing operation the second voltage pulse to one or more data storage cells in another segment, such that one or more data storage cells in the other segment are preset to either the first polarization state or the second polarization state: and dependent on the addressing operation to be carried out, storing information in said one or more preset data storage cells in the other segment after the second active voltage pulse with the same polarity has been applied thereto, said another segment being selected for the second addressing operation on the basis of prior application of active voltage pulses to said two or more electrically separated segments.

Further features and advantages shall be apparent from the appended dependent claims.

BRIEF DESCRIPTION OF THE DRAWINGS

The invention shall be better understood by way of examples and the following discussion of preferred embodiments read in conjunction with the appended drawing figures, wherein.

DETAILED DESCRIPTION OF CERTAIN PREFERRED EMBODIMENTS

Before giving a detailed description of preferred embodiments, some of the prerequisites as well as topics of importance in the general background of the present invention shall be discussed and analysed in more detail to give a better understanding of the objects achieved by the invention.

Figure 9:
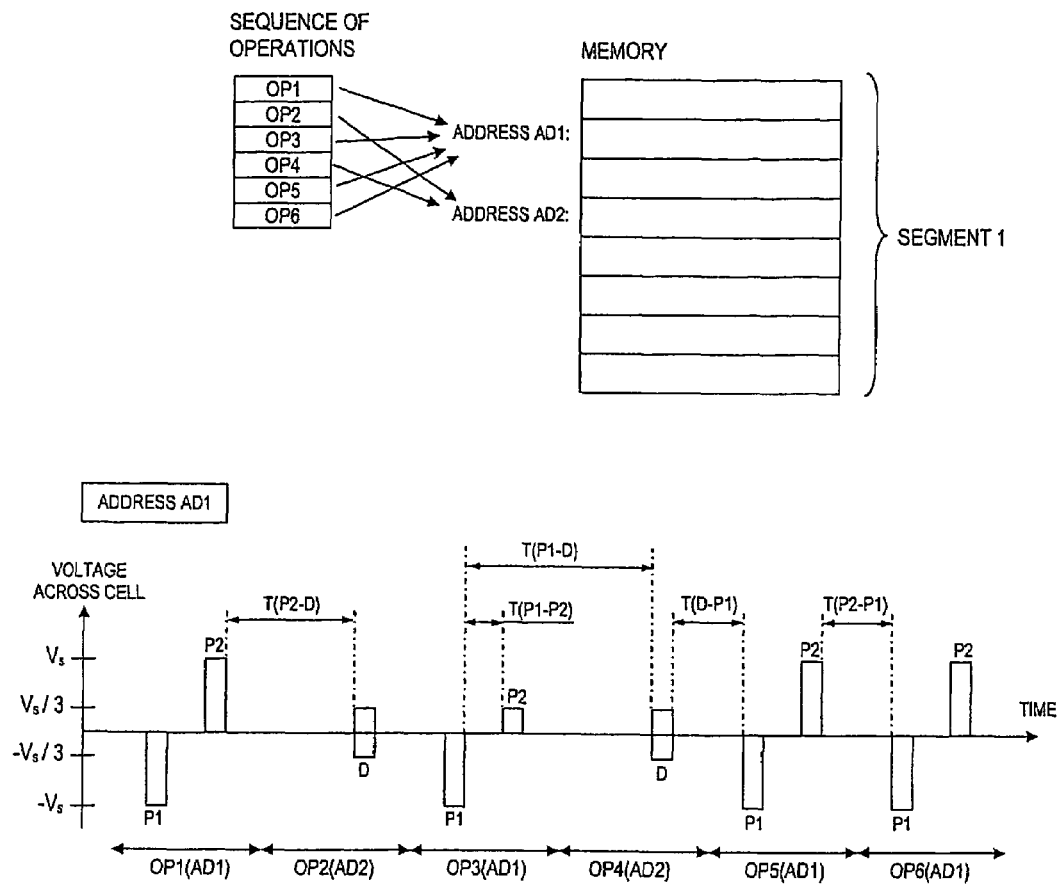

FIG. 9 shows an example of intervals negatively affecting the data rate in a passive matrix-addressable device with memory cells of polarizable material, e.g. a ferroelectric material. The intervals exemplified in FIG. 9 have been identified to contribute the most in limiting the data rate. With reference to FIG. 9, a sequence of operations on two different addresses in the same segment results in a pattern of voltage pulses at a cell at one of the addresses, address AD1. An operation on address AD1 consists of a first active voltage pulse P1 of magnitude $-V_S$ applied to each cell at the address and a second voltage pulse P2, which is either a second active voltage pulse of magnitude $+V_S$ or a disturb pulse of magnitude $V_S/3$. Which voltage to select for the second voltage pulse P2 is optional and depends on the polarization state each cell addressed by the operation shall possess after the operation. The second voltage pulse P2 is an active voltage pulse of $+V_S$ only for those cells that shall change the polarization state set by the first active voltage pulse P1. An operation on address AD2 results in a disturb voltage pulse D on address AD1 of magnitude $+V_S/3$ or $-V_S/3$ depending on the voltage of the second voltage pulse for the address AD2 operation. The interval T(P2-D), i.e. between a second voltage pulse and a disturb pulse originating from a subsequent operation at another address in the same segment, may be a problem, in particular if the cell has been switched from an imprinted direction by P2 and if D occurs in the imprinted direction. The interval T(P1-D), i.e. between a first active voltage pulse and a disturb pulse originating from a subsequent operation at another address in the same segment, is typically longer than T(P2-D), but may still be problematic of almost the same reasons; here if the cell has been switched from an imprinted direction by P1 and if D occurs in the P2 direction. The interval T(P1-P2) is the interval between the first active voltage pulse and the optional second voltage pulse and may be a problem since it occurs within an addressing operation and is independent of coining operations, which may be a problem in particular if the cell has been switched from an imprinted direction by P1 and if the P2 pulse is not supposed to switch the cell back to the imprinted direction, for example when P2 is of the non-switching magnitude $V_S/3$ as in the illustrated example. If the interval between P1 and P2 is too small, P2 may then nevertheless and accidentally switch the cell back in the imprinted P2 direction due to the aforementioned imprint effect. Yet two other intervals of special interest exist, viz. T(D-P1), i.e. between a disturb pulse originating from an operation at another address in the same segment and a first active voltage pulse of a subsequent operation, and T(P2-P1), i.e. between a second voltage pulse in an operation and a first active voltage pulse of a subsequent operation. These two intervals are mainly of concern due to sneak and relaxation currents, especially considering that all cells along the bit line of the addressed cell in this example will be subjected to voltages of $V_S/3$ which all together give arise to substantial sneak and relaxation currents which in their turn may mask charges to be sensed in a subsequent read operation.

Figure 4A:
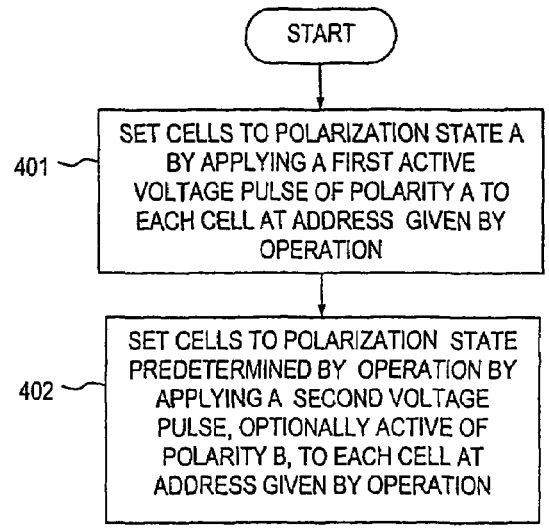
Figures 4B, 4C:
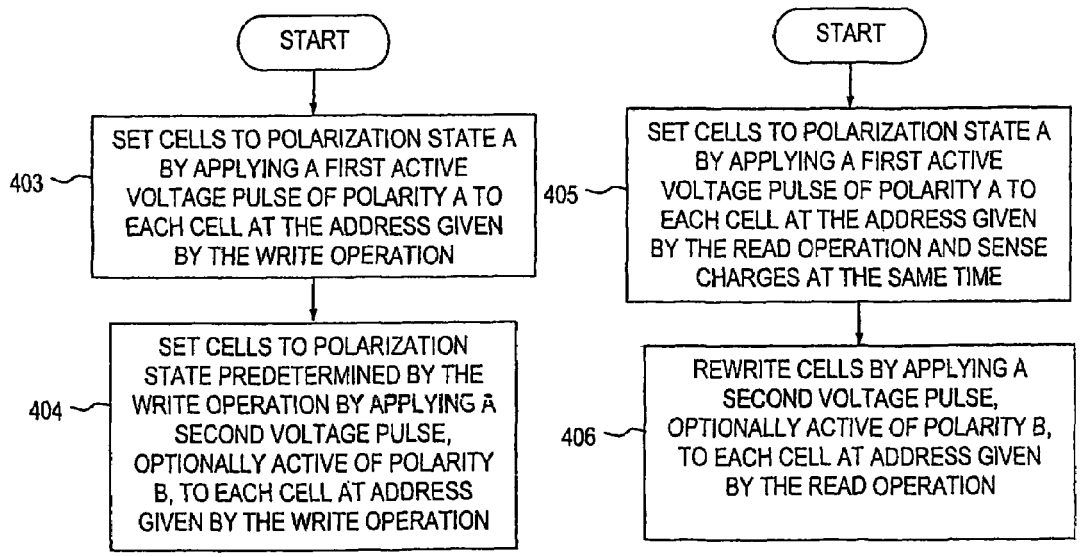
Figure 5:
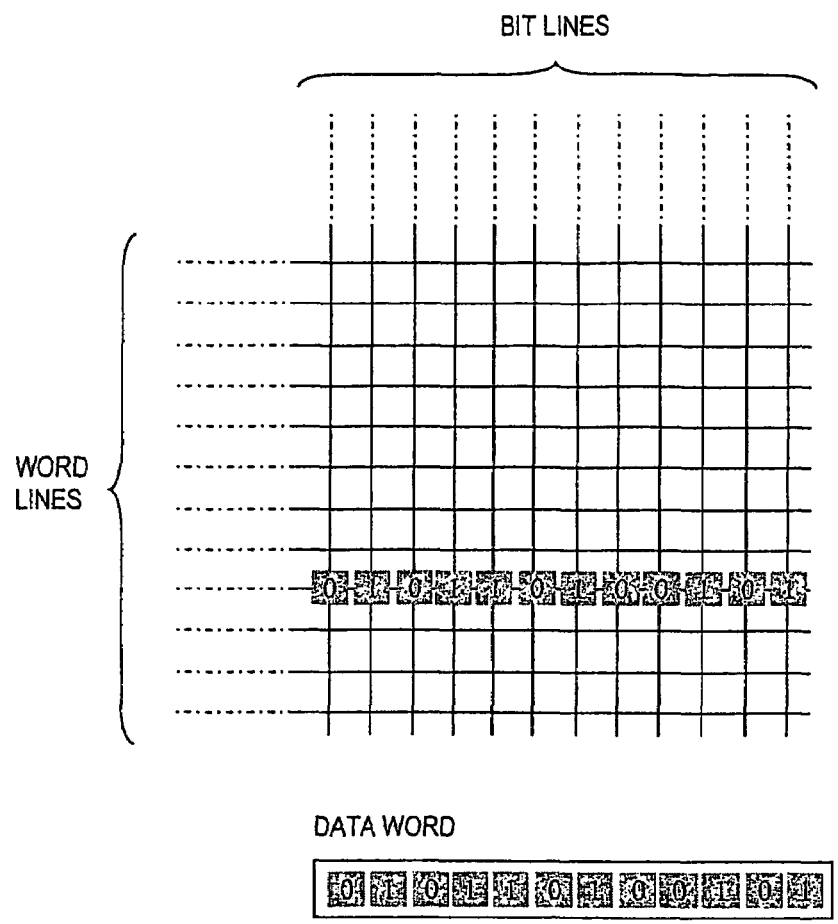
Figure 6:
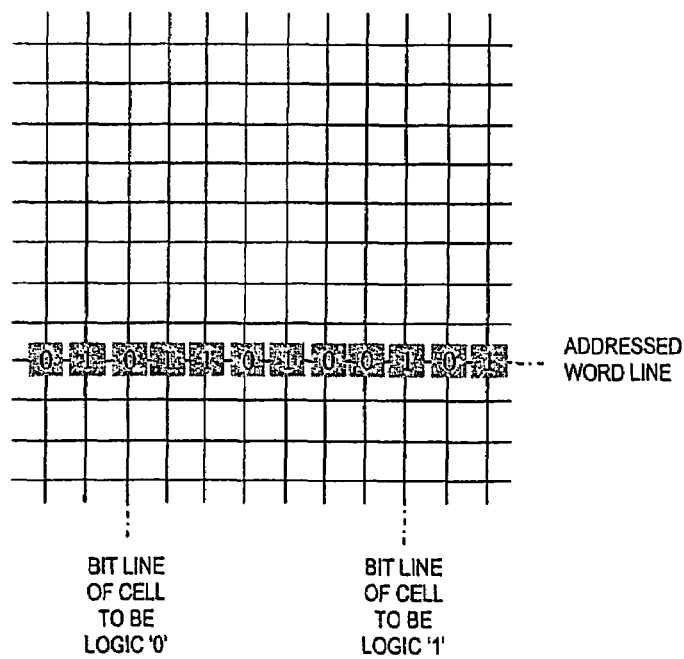
Figure 6:
Figure 7A:
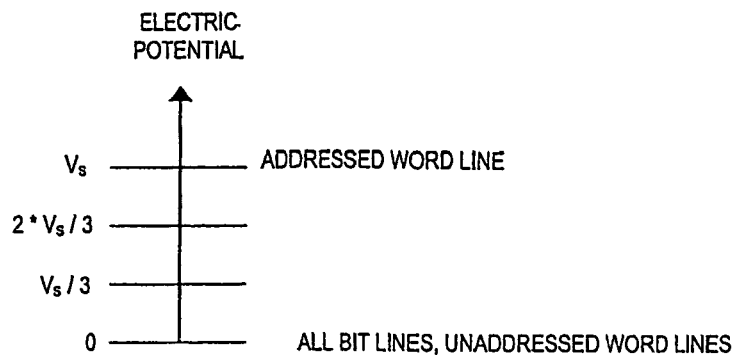
Figure 7B:
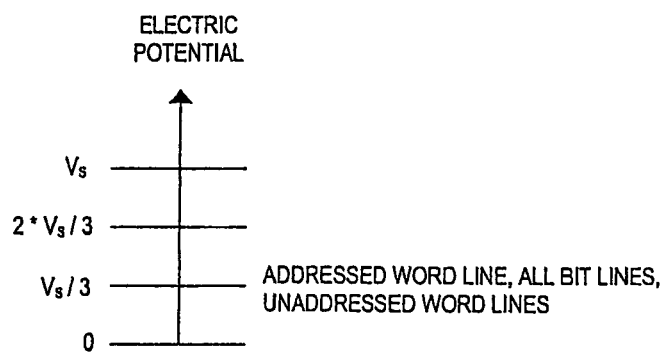
Figure 7C:
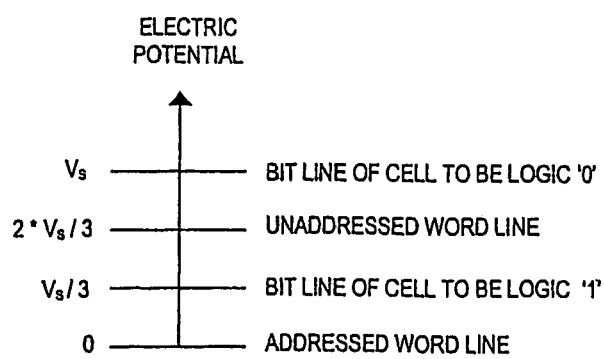
Figure 8:
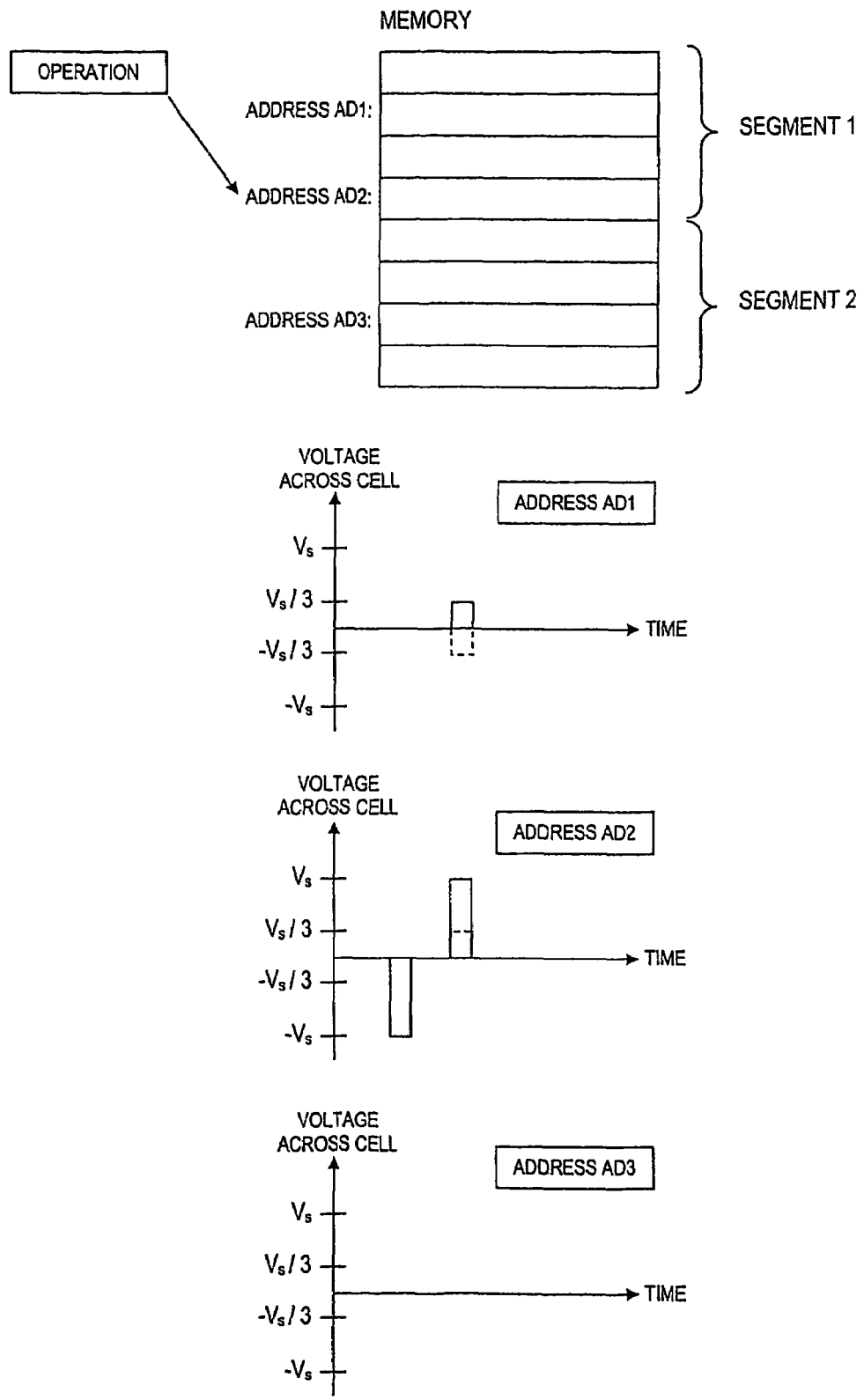

In FIGS. 4a-4c it was shown that a general read or write operation on a passive matrix-addressable memory according to a pulse protocol of interest for the present invention, could be described as involving two steps 401, 402 wherein an active voltage pulse may be applied to addressed cells within each step. Beside the ordinary write and read operation as described in FIGS. 4b and 4c, it is possible to create variants of operations for certain special situations that makes it possible for a user, e.g. a programmer, to more efficiently operate the memory and thereby for example increase the data rate. Including the two ordinary operations in FIGS. 4b and 4c, there are mainly six different operation variants possible:

I) READ WITH WRITE-BACK. Ordinary read operation according to FIG. 4c, described from an active pulse application point of view by FIG. 4a. To retain the data destructively read during application of the first active voltage pulse, the consecutive second voltage pulse is a write-back pulse that makes each addressed cell to represent the same binary value as before execution of the operation.

II) WRITE. Ordinary write according to FIG. 4b, generically described from an active pulse application point of view by FIG. 4a. Any stored logic value prior to this operation will be destroyed during application of the first active voltage pulse that sets each addressed cell to the same polarization state. The second voltage pulse then optionally switches the polarization state for selected addressed cells such that the cells addressed by the operation have been brought to correspond to the binary value as defined by the write operation.

III) READ WITH WRITE-DIFFERENT. Situation where data are read during application of the first active voltage pulse, like in the first step 405 in FIG. 4c. Other data than the read data are written to the cells, like in the second step 404 of FIG. 4b, such that a read and a write operation are combined in one operation. Generically described from an active pulse application point of view by FIG. 4a.

IV) READ ONCE. Situation where data need not be stored any longer after being read. May be accomplished by only executing the first step 405 of FIG. 4c, which reads the cells and sets all addressed cells to one and the same polarization state. Generically described from an active pulse application point of view by first step 401 in FIG. 4a. Except from reading the data, the result is that data is erased and that each addressed cell is set to the same polarization state.

V) ERASE/PRE-SET. Situation where data should be erased from memory, but not need to be read. May be accomplished by only performing the first step 403 of FIG. 4b that sets all addressed cells to one and the same polarization state. Generically described from an active pulse application point of view by first step 401 in FIG. 4a. The result is that data are erased and that each addressed cell is set to the same polarization state.

VI) WRITE TO PRE-SET. If cells previously have been set to one and the same polarization state, like for example after an operation according to variants IV or V, it is possible with an operation that later only executes the second step 404 of FIG. 4b on any such pre-set cells. Generically described from a pulse application point of view by second step 402 in FIG. 4a, provided the address already contains cells that are pre-set to the first polarization state.

Even though any of the described special operation variants III-VI may be created and made user available in addition to the ordinary read and write operations I-II, it is up to the user to select and apply appropriate operations to be able to gain any data rate increase.

Preferred embodiments of the present invention that will be presented in flow chart figures hereafter will primarily correspond to the operation variants that are generically described by FIG. 4a, i.e. variants I-III above. Other possible variants III-VI, or specific variants I-VI that result in changes to what is presented in a figure, will be described separately in the accompanying text with reference to the flow chart and to the corresponding operation variants, i.e. I-III.

One embodiment that deals with the identified intervals according to FIG. 9 and that admits increased data rate, is to identify any occurrence of the above described intervals of FIG. 9 during use, and at those occasions increase the time interval between applied voltages pulses. This would increase data rates compared to the case where large enough intervals are always inserted by default, but requires the specific cases to be clearly identified in run-time. Alternatives to this "brute force" solution of identifying intervals and accordingly increasing time between voltage pulses will be presented in embodiments discussed in the following.

The flow chart figures of the preferred embodiments may be compared to the previously discussed FIG. 4a that shows a generic flow chart of an ordinary read or write operation. Both of the steps 401, 402 in FIG. 4a may be found as parts in preferred embodiments of the present invention.

By studying the intervals exemplified in FIG. 9, it is revealed that consecutive operations addressing the same segment are one factor that negatively affects the data rate and hence should be avoided.

Figure 10:
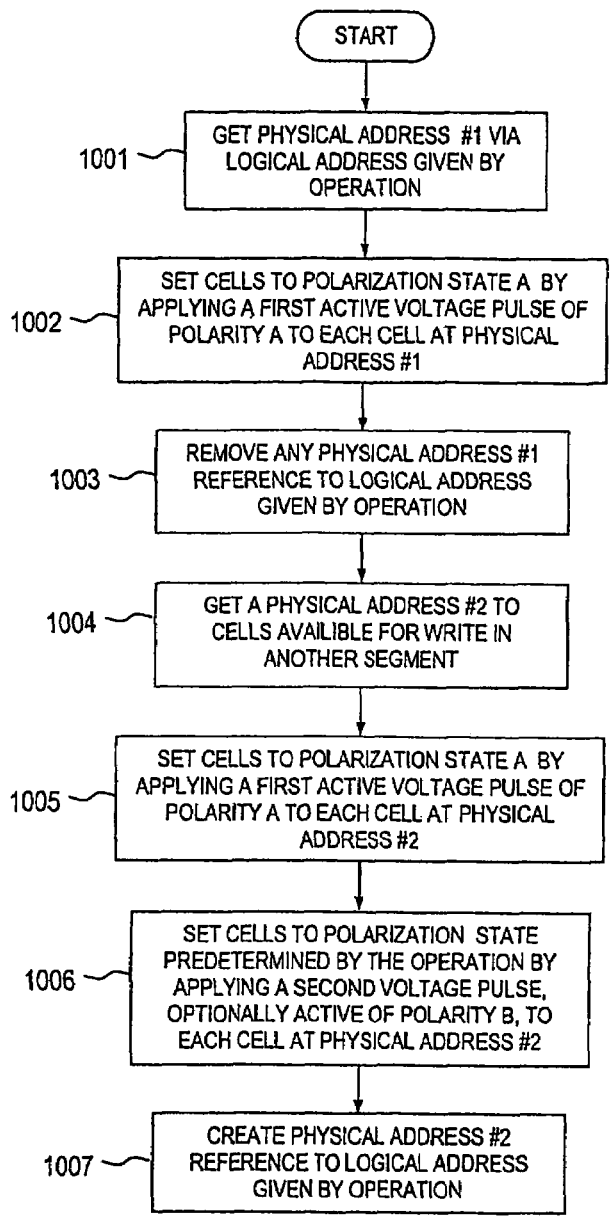

FIG. 10 illustrates a first embodiment of the method according to the invention that reduces consecutive addressing in the same segment by directing data addressed by an operation to another segment. FIG. 10 in particular shows a I) READ WITH WRITE-BACK and a III) READ WITH WRITE-DIFFERENT operation. With reference to FIG. 10, in the first step 1001 a first physical address is retrieved that corresponds to the address given by the operation, i.e. the logical address; then follows a step 1002 wherein each cell at the first physical address are subjected to a first active voltage pulse of polarity A, cf. FIG. 4a, step 401 and FIG. 4c, step 405, which sets all addressed cells to the same polarization state A, corresponding to the previously mentioned first polarization state. In a next step 1003 the reference between the first physical address and the logical address are removed and after this a second physical address is retrieved in step 1004, pointing to another physical address available in another segment; then in step 1005 each cell at the second physical address is subjected to a first active voltage pulse of polarity A, which sets all addressed cells to the same polarization state A, corresponding to the previous mentioned first polarization state. After this the second voltage pulse is applied in step 1006 to switch certain cells to accomplish cell polarization states predetermined by the operation, and lastly in step 1007 a reference is created between the second physical address now containing the data specified by the operation, and the logical address.

The described embodiment entails a change of physical addresses, such that for example data in a read operation changes location from the first physical address in one segment to another second physical address in another segment. To obtain adequate intervals between operations in the same segment, the selection of physical addresses in other segments in step 1004 should be cycled, by for example always selecting the segment with the longest time since last used, or rather since last subjected to an active voltage pulse.

With reference to FIG. 10 now follows descriptions of other operation variants supported within the embodiment:

II) WRITE. In case the operation is an ordinary write operation, the first two steps 1001, 1002 may be bypassed since no data need to be read.

IV) or V) READ ONCE or ERASE/PRE-SET. For these types of operation variants only the first two steps 1001, 1002 need to be executed.

VII) WRITE TO PRE-SET. In case logical addresses to pre-set cells are known, i.e. addresses that have been subjected to the IV) or V) operation variants, it is possible to perform this operation on such an address directly. However, this implies that the built-in "intelligence" that may be used, e.g. a decision algorithm or similar, when getting a second physical address in another segment in step 1004, will be bypassed. Instead it will be up to the issuer of this operation to select an appropriate logical address. It should though be recalled that a logical address typically does not have an evident relationship to a segment, as is the case between a physical address and a segment. Hence it may be hard for the issuer of this operation variant to avoid addressing the same segment consecutively. If this operation variant nevertheless is used, the steps to be performed are the first step 1001 and then the sixth step 1006. The latter should be performed on the first physical address instead of the second physical address as stated in the figure.

Part of the embodiment of the method according to the invention as illustrated in FIG. 10 and described above may be identified as something commonly known as "memory address mapping" which is a well-known method to connect a logical address to a physical ditto.

Figure 11A:
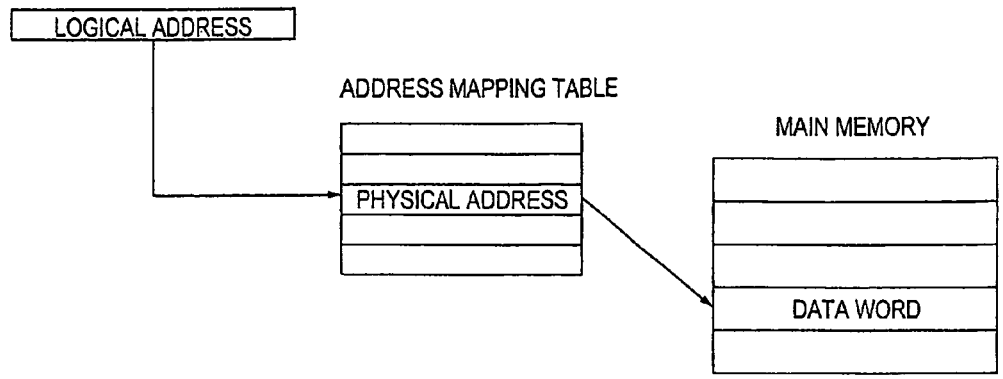

FIG. 11a explains the general concept of memory address mapping known from the prior art. The logical address points to a location in an address mapping table which contains the physical address which in turn points to the data in the main memory. The memory containing the address mapping table is typically not the same memory as referred to by the physical addresses in the address mapping table. Normally the address mapping table memory is located in a fast and smaller volatile RAM or a similar volatile more hardware-oriented memory, even though nothing prevents it from being located in a separate but similar non-volatile memory as the main memory. However, if the address mapping table is located in a volatile memory, a risk of losing data is introduced despite the non-volatility of the main memory, for example if a power failure erases the address mapping table content. A solution to this is to store information in the main non-volatile memory such that the address mapping table may be reconstructed after for example a power failure.

Figure 11B:
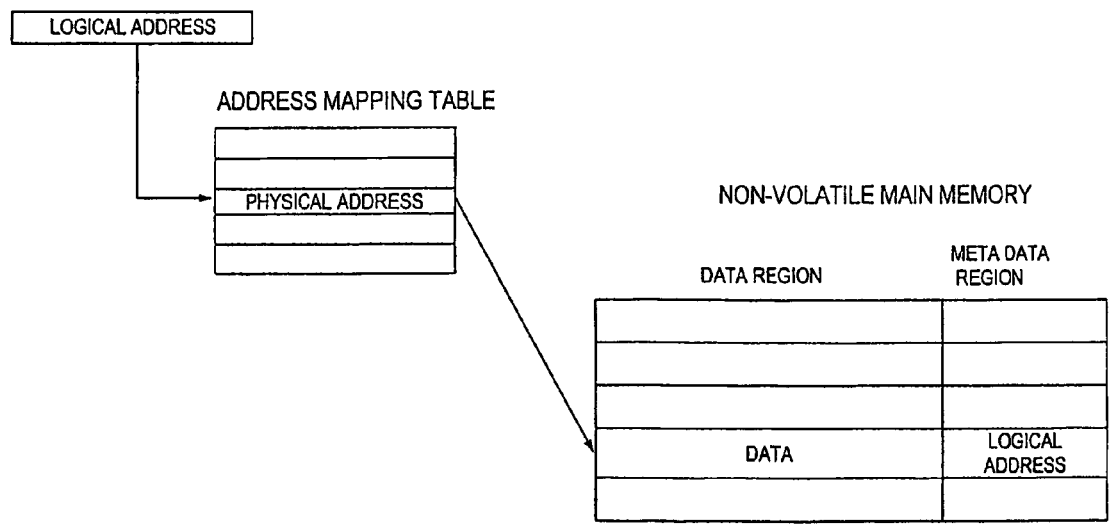

FIG. 11b illustrates a solution wherein the logical address is stored at the physical address in the main memory at a, in a for this purpose introduced "meta-data region", which name indicates that the region is introduced to store descriptive non-ordinary data, in this case an address. The content of the meta-data region should normally be transparent and not visible to a user of the memory. After losing the address mapping table, a new correct table can be built up by stepping through the physical addresses of the main memory and at each physical memory address reading the meta-data region to get the logical address. An example referring to the embodiment as illustrated in FIG. 10, here the storage of the logical address in the meta-data region would take place in connection with application of the second voltage pulse in step 1006.

Figure 1:
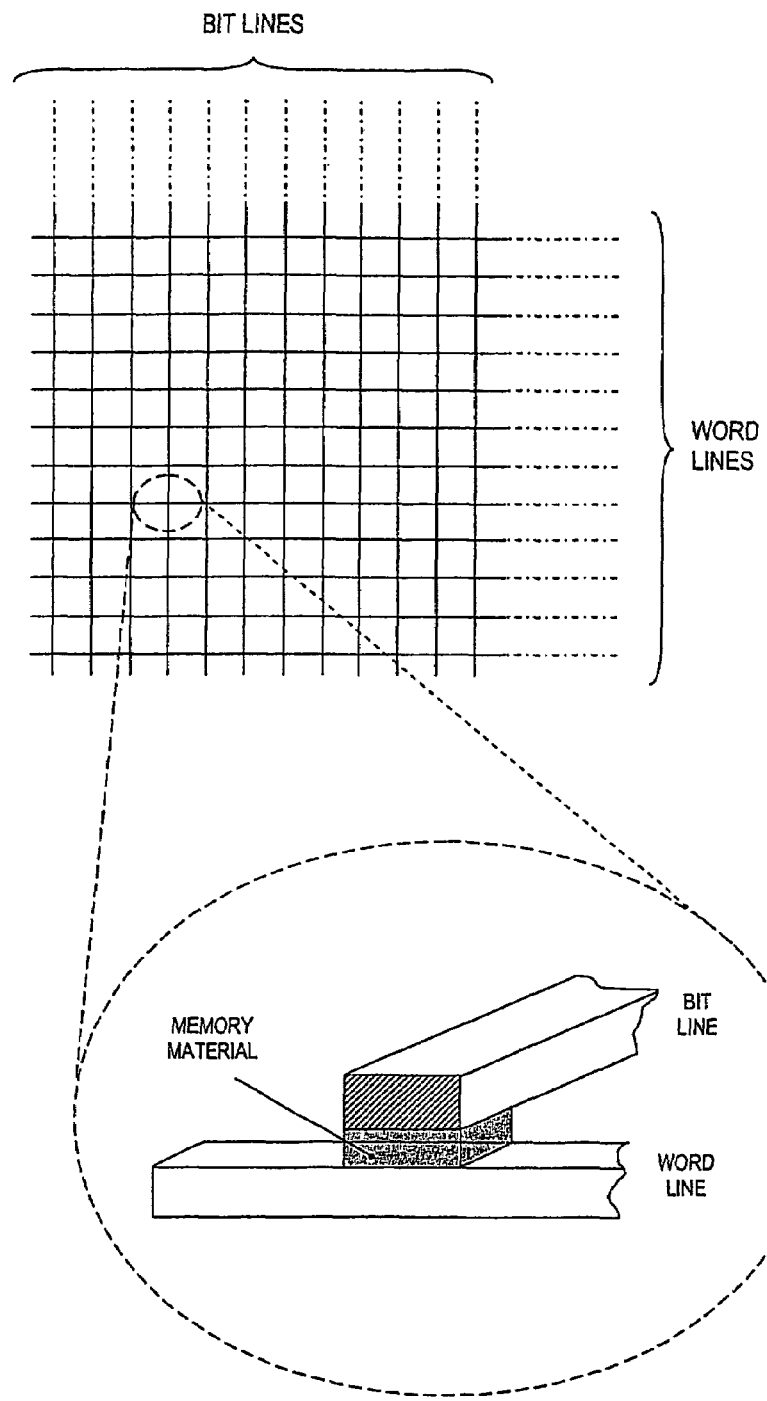
FIG. 1 shows an example of a passive matrix memory with memory material located between and in the intersections of bit line electrodes and word line electrodes, as known in the prior art and-mentioned above, FIG. 2 a principle drawing of a hysteresis curve for a polarizable material, e.g. a ferroelectric, as known in the prior art and mentioned above FIG. 3 an example of resulting voltage pulses over an addressed cell in a passive matrix-addressable device during operation, as known in the prior art and mentioned above, FIG. 4a a flow chart describing the principle of the voltage pulses in FIG. 3, as known in the prior art and mentioned above, FIG. 4b the flowchart in FIG. 4a for the specific case of an ordinary write operation, as known in the prior art and mentioned above, FIG. 4c the flow chart in FIG. 4a for the specific case of an ordinary read with write-back operation, as known in the prior art and mentioned above, FIG. 5 an example of location of stored data in a passive matrix-addressable device, as known in the prior art and mentioned above, FIG. 6 denominations for electrodes during execution of an operation on addressed cells in a passive matrix-addressable device, as known in the prior art and mentioned above, FIG. 7a an example of possible electric potentials on electrodes to subject only the addressed cell(s) to a voltage pulse like the first voltage pulse in FIG. 3, as known in the prior art and mentioned above, FIG. 7b an example of possible electric potentials on electrodes to achieve a quiescent state like between the voltage pulses in FIG. 3, as known in the prior art and mentioned above, FIG. 7c an example of possible electric potentials on electrodes to subject an optional part of the addressed cell(s) to a second active voltage pulse as shown by the second voltage pulse in FIG. 3, as known in the prior art and mentioned above, FIG. 8 the absence of disturb voltages on unaddressed cells in an unselected segment, in an electrically segmented matrix-addressable device used with the present invention, FIG. 9 intervals between pulses applied to a cell in the passive matrix-addressable device as used with the present invention, and causing a readout data rate, FIG. 10 flow chart of an embodiment of the present invention where an addressing operation is directed to another segment in the segmented device as used with the present invention, FIG. 11a the concept of memory address mapping in the present invention using an address mapping table, FIG. 11b the concept of memory mapping in the present invention using an address mapping table and storage of the logical address at the physical address in a non-volatile main memory to enable restoration of the address mapping table, FIG. 12 example of an address entry in an address mapping table in the present invention, FIG. 13 example of a segment entry in a segment table in the present invention, FIG. 14 example of usage in the present invention of a segment table as a queue, FIG. 15 flow chart of a supporting mechanism as used with the present invention for monitoring the segment table and unsets any 'lock state' mark in the segment table at appropriate time, FIG. 16 flow chart of a first embodiment according to the present invention using a segment table and an address mapping table as a queue, and that applies the first active voltage pulse and the optional second voltage pulse to different segments and conditionally introduces a delay before application of the first active voltage pulse, FIG. 17 flow chart of an embodiment similar to that in FIG. 16, but where the conditional delay is replaced by a mechanism using segment table time stamps, FIG. 18 flow chart of an embodiment similar to that in FIG. 17, but where a 'lock state' mark is used instead of a timestamp and to secure that the second voltage pulse in an addressing operation is not applied too soon to a segment, FIG. 19 flow chart of an embodiment similar to that in FIG. 18, but where the conditional delay is replaced by checking the consecutive operation and conditionally change segment for the application of the second voltage pulse, FIG. 20 flow chart of an embodiment similar to that in FIG. 15, but where additional information on the pre-set cells polarization state is used in application of the second voltage pulse, FIG. 21 flow chart of an embodiment similar to that in FIG. 17, but where physical addresses are exchanged instead of replaced in the address mapping table, FIG. 22a system invisible pre-set cells where the address mapping table as used with present invention does not contain physical addresses to pre-set cells, FIG. 22b system visible pre-set cells where the address mapping table as used with present invention contains physical addresses to pre-set cells as well as ordinary data, FIG. 23 a flow chart of a second embodiment as used with present invention distributing pre-set cells among the segments during system idle times, FIG. 24 a flow chart of a third embodiment as used with present invention creating and distributing system visible preset cells at free memory addresses, FIG. 25 a flow chart of a fourth embodiment as used with present invention for supporting both system visible and system invisible pre-set cells and that provides quick write by utilizing system visible pre-set cells, FIG. 26 a flow chart of a fifth embodiment as used with present invention for supporting only system visible pre-set cells, which keeps track of the total number of pre-set cells and that provides quick write by utilizing system visible pre-set cells, FIG. 27 a flow chart of a sixth embodiment as used with present invention for supporting both system visible and system invisible pre-set cells and that provides quick write by utilizing system visible pre-set cells, FIG. 28 a first embodiment of a device that may be used for implementing the method of the invention using the main memory to directly handle data, and FIG. 29 an embodiment of a device that may implement the methods of the invention using the memory control unit to handle data.
Figure 2:
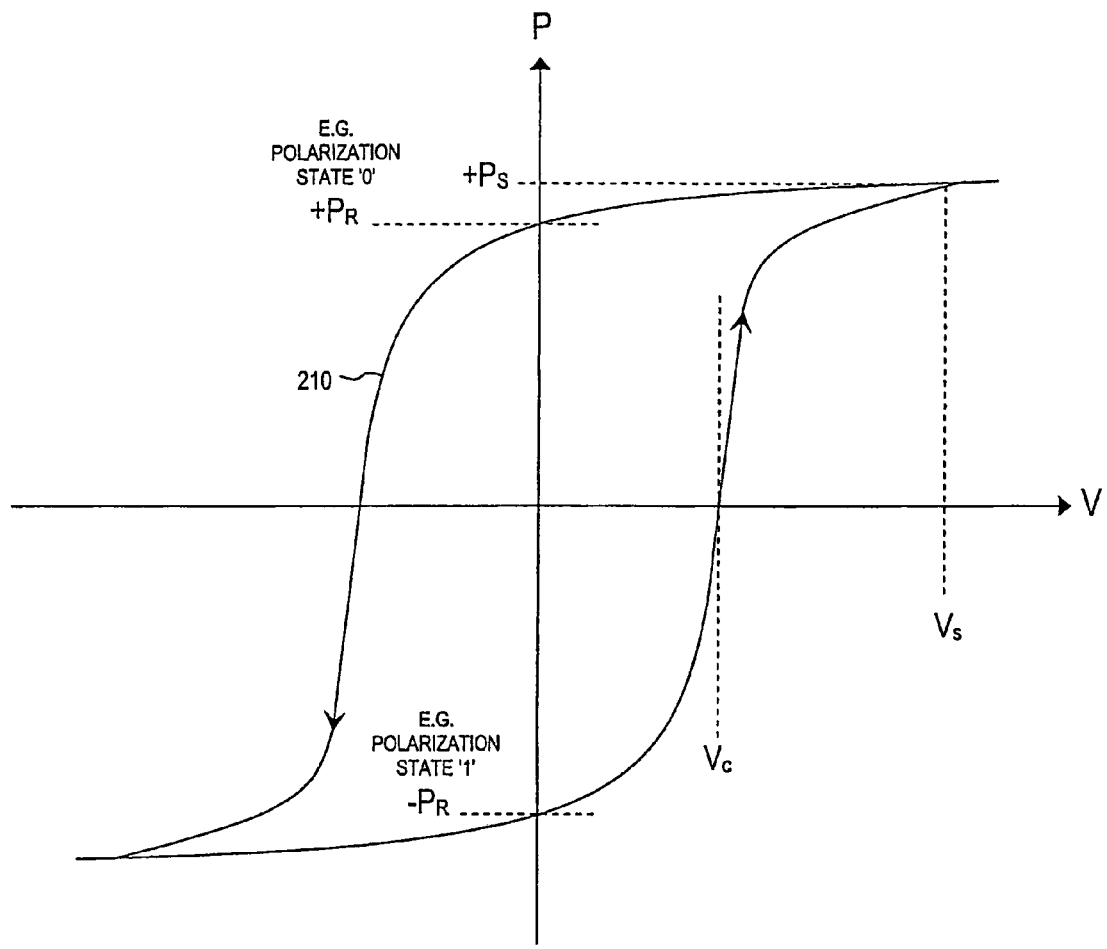
Figure 3:
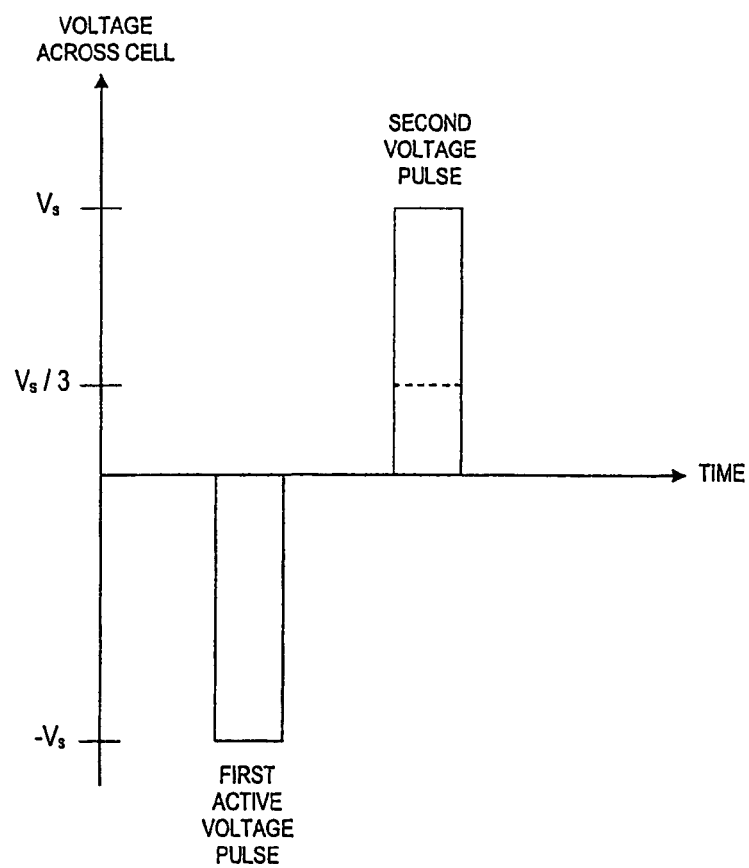
Figures 12, 13, 14:
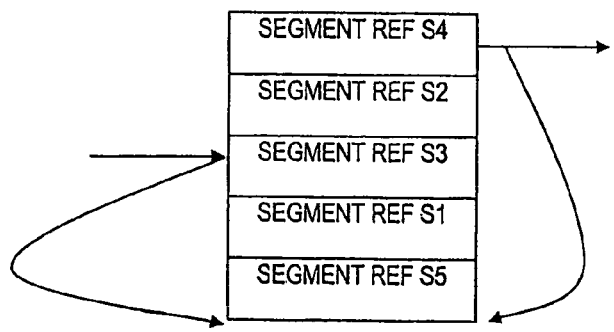

FIG. 12 presents the example of storage of additional information in connection with the physical memory addresses in an address mapping table. The additional information may consists of a 'pre-set' mark, which when set, indicates that the memory cells at the corresponding physical address are pre-set to a given polarization state or, when unset, indicates that the memory cells contains ordinary data. Cells at a certain address become pre-set after each cell at the address has been subjected to an active voltage pulse of a single polarity, such as for example after the first active voltage pulse in an operation which sets all cells at the address to the same polarization state, like in FIG. 3 or after the first step in FIGS. 4a, 4b or 4c. The 'pre-set' mark may be binary such that for example a '1' indicates pre-set cells and a '0' indicates ordinary data at the physical address. Another type of additional information in the address mapping table may be an indicator on the polarization of the pre-set cells as illustrated with the 'pre-set polarization A' mark in FIG. 12. In case of pre-set cells, this additional information indicates whether the pre-set cells at the physical address are of polarization state A or not. Since there typically are only two different polarization states possible, pre-set cells that are not in the first polarization state A, have to be in the second polarization state B. Another possible field of additional information is a segment reference that identifies the segment to which the physical address belongs; however, it should be noted that in some cases the segment reference may be implicitly incorporated in the physical address itself, for example when the physical addresses are split into ranges wherein each range corresponds to a certain segment. If it is possible to select or define physical addresses such that for example a certain position or positions in the binary or hexadecimal representation of the physical address will identify the segment this may likely be an advantageous way to identify segments. If and when the segment reference is included in the physical address there will be no need to store additional and memory consuming information on the segment reference. Specific use of the additional information in the address mapping table, including the concept "pre-set" cells, will be further exposited below.

The method of the invention implemented according to the first embodiment as presented above, must not only have to be able to retrieve physical address references for the logical addresses given by the operation addressing the memory, but also have to be able to retrieve address references to other segments. For this purpose yet another table is introduced, viz. a "segment table" which for segment contains information on pre-set cells or pre-set cell addresses pertaining to said segment.

FIG. 13 illustrates a segment entry in a segment table. An entry is identified by a segment reference, for example a unique number or any other identification of the segment; further a field 'number of pre-set cell addresses' may be connected to the segment reference, referring to the number of pre-set memory cell addresses in said segment, i.e. addresses where all memory cells are set to one and the same polarization state. Note that the number of pre-set cells per pre-set cell address typically is the same as the word size of the memory. Besides storing the number of pre-set cell addressed in each segment there may also be a field 'timestamp of last segment access' which contains the timestamp from last time any address in the segment was accessed, i.e. since an active voltage pulse was applied to any cell in the segment. The timestamp is typically a snapshot of an absolute clock value obtained from the clock of the device employing the segment table. By reason of convenience, the timestamp will typically be updated every time any physical address entry is retrieved from, or added to the segment table. Another field that may be connected to each segment entry in the segment table is a 'lock state' mark. When it is set, the 'lock state' mark indicates that the segment is locked and that physical address entries neither may be retrieved nor added, which implies that no active voltage pulse may be applied to the segment. The 'lock state' mark may be binary such that for example a '1' indicates a set mark, i.e. a locked state and a non-available segment, and a '0' indicates an unset mark, i.e. an available segment. Thus, the 'lock state' mark provides a simple and rapid means of clearing access to a given physical address. Both the 'timestamp' and the 'lock state' mark will be further explained below. For each segment reference entry in the segment table there is further associated a listing of physical addresses to all pre-set cells belonging to the segment in question. In a similar way as in the address mapping table, each listed physical address may be linked with additional information, like for example a 'pre-set polarization A' mark as given in the FIG. 13, and to be interpreted in the same way as previously described for the address mapping table.

Similar to the address mapping table, a segment table may be placed in a fast volatile RAM or in some other type of fast, perhaps more hardware-oriented memory, and consequently it may also need to be restored in case of for example a power failure. This is either taken care of by utilizing additional information stored in the address mapping table which first is restored, or the segment table is restored by stepping through the memory and register each dress containing pre-set cells, something which is possible since all cells at pre-set cell address are in a single polarization state and thereby entifiable.

When selecting an address in another segment, as for example as in the fourth step 1004 in FIG. 10 of the first embodiment, it is considered advantageous to use the pre-set cell address in the segment with the longest elapsed time since last subjected to an active voltage pulse. Obtaining a reference to such a pre-set cell address may be accomplished by using the segment table as a queue, wherein the segment most recently subjected to an active pulse is placed last in the queue. In this way a reference to the segment with the longest elapsed time since last subjected to an active pulse will be available first in the queue and may be retrieved therefrom when appropriate.

FIG. 14 illustrates a segment table used as queue: An operation may address a segment somewhere in the queue, with the result that the segment is subjected to an active voltage pulse and thereby placed last in the queue. In another situation a segment reference may be retrieved from the head of the queue and subjected to an active pulse and thereafter placed last in the queue.

An alternative to the queue may be to check and compare segment entries in the segment table and pick the one with the oldest timestamp, or to sort the segment table entries in a descending or ascending order based on the timestamps and then retrieve a segment reference from first or last location in the resulting sorted segment table.

Even though a reference to the segment with the longest elapsed time since last addressed may be obtained, for example by using the segment table as a queue as described above, there may still be situations where the longest time is not sufficient. When such a situation is encountered, the timestamp of last segment access may be compared to the current time, typically a snapshot of a clock value, and in case the difference is less than a predetermined value, a delay equal to the difference may be imposed. However, the comparison itself may require a non-trifling amount of time or system resources, something that may be particularly undesirable during execution of an operation. To avoid comparison during execution of an operation, a method is proposed that runs in parallel and/or between execution of operations, wherein the timestamps since last segment access are monitored and the 'lock state' mark being unset in case the comparison with present time results in a difference between the values that exceed a predetermined value. This of course implies that a 'lock state' mark in the segment table is being set when accessing the segment, for example when updating the segment table after application of an active voltage pulse during execution of an operation.

Figure 15:
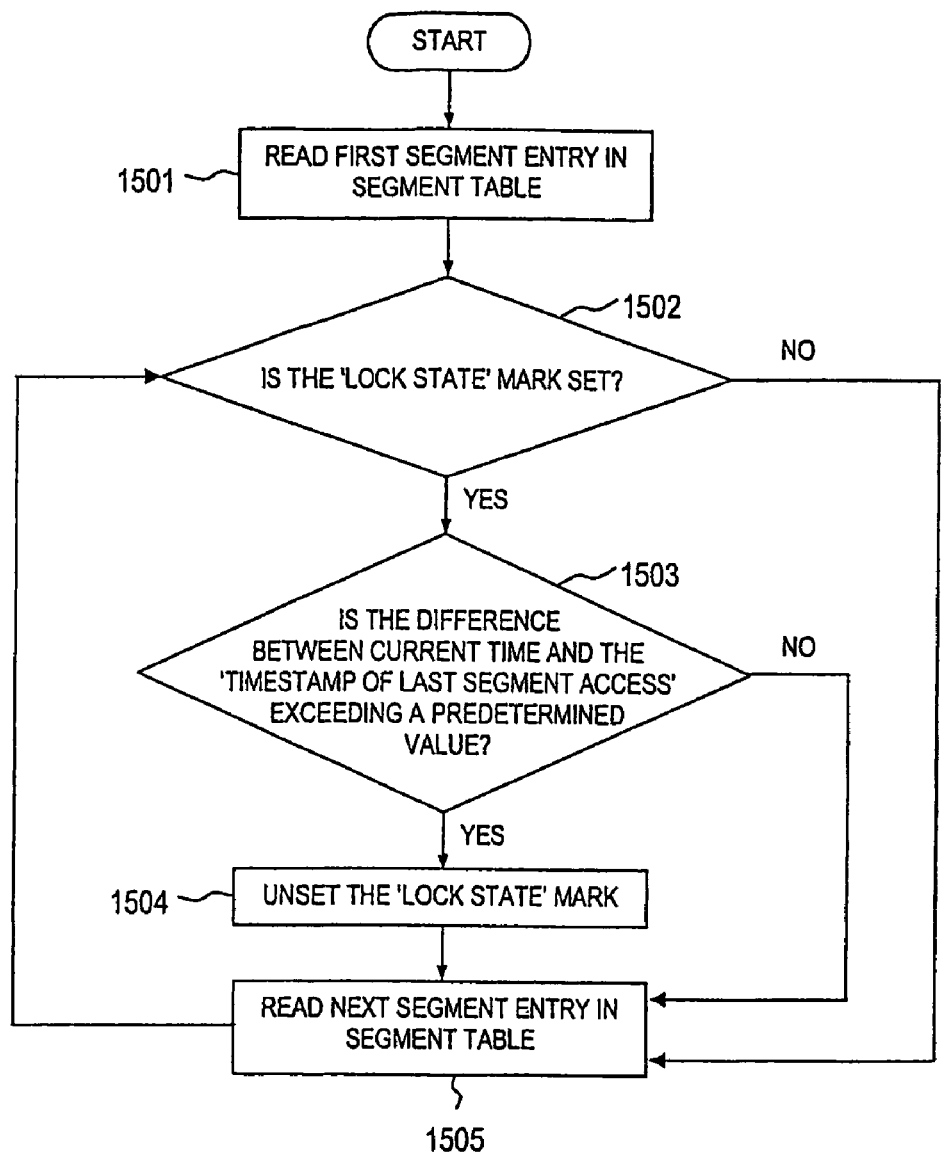

FIG. 15 shows an embodiment of the method according to the present invention that concerns un-setting of 'lock-state' marks based on elapsed time since segment accesses. In step 1501 of FIG. 15, the first segment entry of the segment table is read and then it is checked if the 'lock state' mark is set in step 1502. If that is not the case, the next segment entry is read in step 1505 and the check is repeated; if the 'lock state' mark is set, a step 1503 follows wherein the present time and the timestamp is compared and in case the difference exceeds a predetermined value, the 'lock state mark' of the segment entry is unset in step 1504; then the next segment entry is read in step 1505. If the difference between present time and the 'timestamp of last segment access' as found in step 1503 is not exceeding the predetermined value, the 'lock state' mark should not be unset; instead the next segment entry is directly read in step 1505. After all the segment entries have been cycled through, the procedure is repeated and the first segment entry is read again in step 1501 etc. The two consecutive checks in steps 1502, 1503 may seem time-consuming, but since a 'lock state' mark typically is of the size of a bit and follows the timestamp in the segment table, as for example as illustrated in FIG. 14, the two checks in steps 1502, 1503 may easily be performed at the same time in a device implementing the method. Thus, the un-set procedure can be carried out without significant speed penalty in conjunction with e.g. read and write operations that are part of the regular operation of the device. Additionally, the un-set procedure can be performed during idle time periods, optionally coordinated with relocation of pre-set cells among segments or with creation of new pre-set cells in selected segments.

It is considered advantageous also to implement the address lists for each segment as queues, i.e. for each segment putting new pre-set cell addresses last in the address list and retrieving and removing addresses from first location in the address list for each segment.

Notable in the first embodiment according to FIG. 10 is that three active pulses may have to be applied for one operation in the case of a read operation with preservation of the read value, something which negatively will affect the data rate compared to a "two active voltage pulses" situation. By investigating the intervals as presented in FIG. 9 further, it is found that an operation first sets all addressed cells to the same first polarization state and that the limiter of the data rate is intervals between pulses in the same segment, i.e. not necessarily only consecutive operations in the same segment. Since the first polarization state is pre-defined, it may as well be pre-set, i.e. the cells involved in an operation may be set to the first polarization state before execution of the operation. It will now be disclosed in embodiments wherein the availability of addresses to such pre-set cells together with address mapping, makes it possible to achieve segment-separated voltage pulses for an operation and to achieve use of only two active voltage pulses for an ordinary read operation with preservation of the read data.

Figure 16:
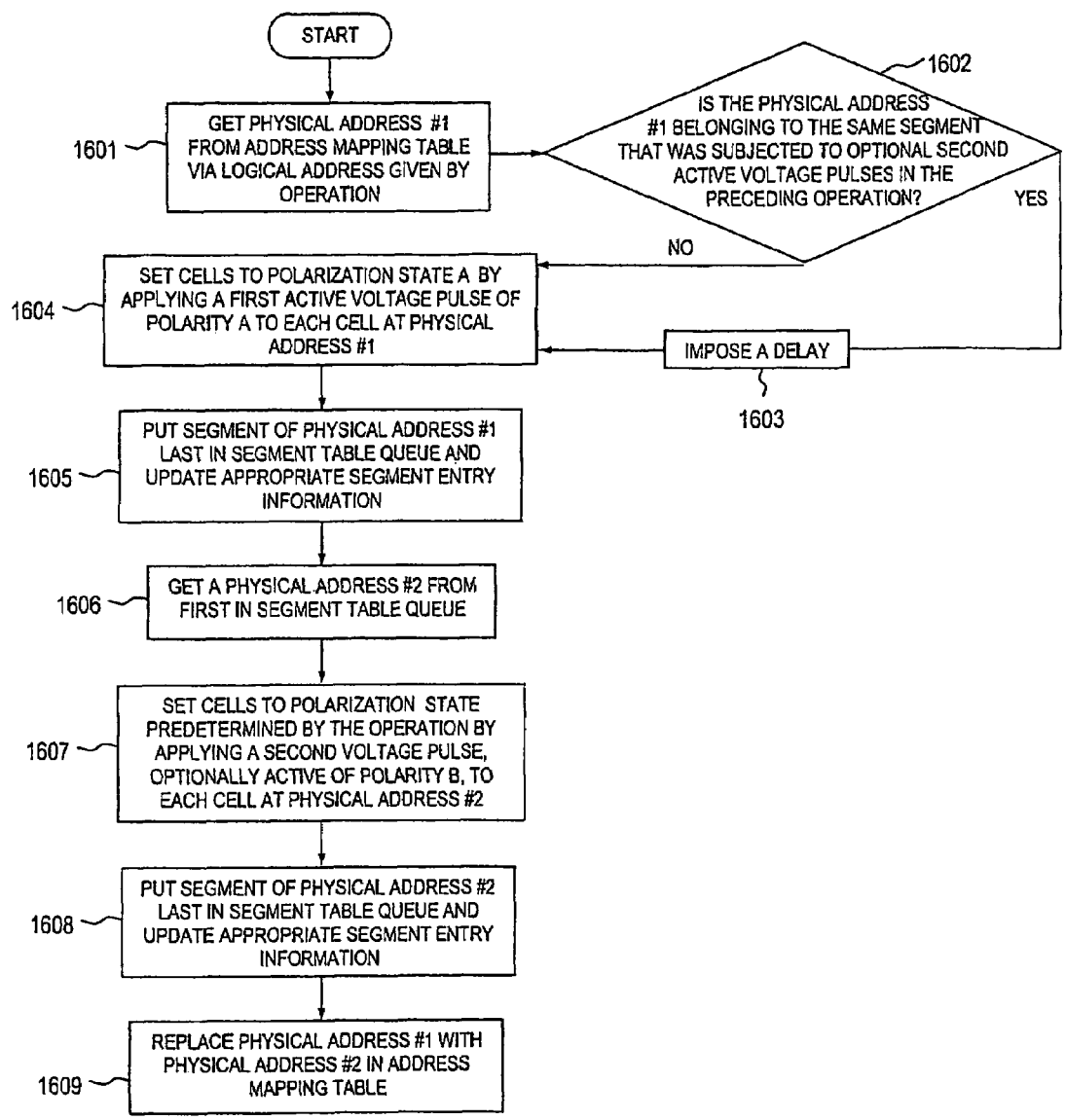
Figure 21:
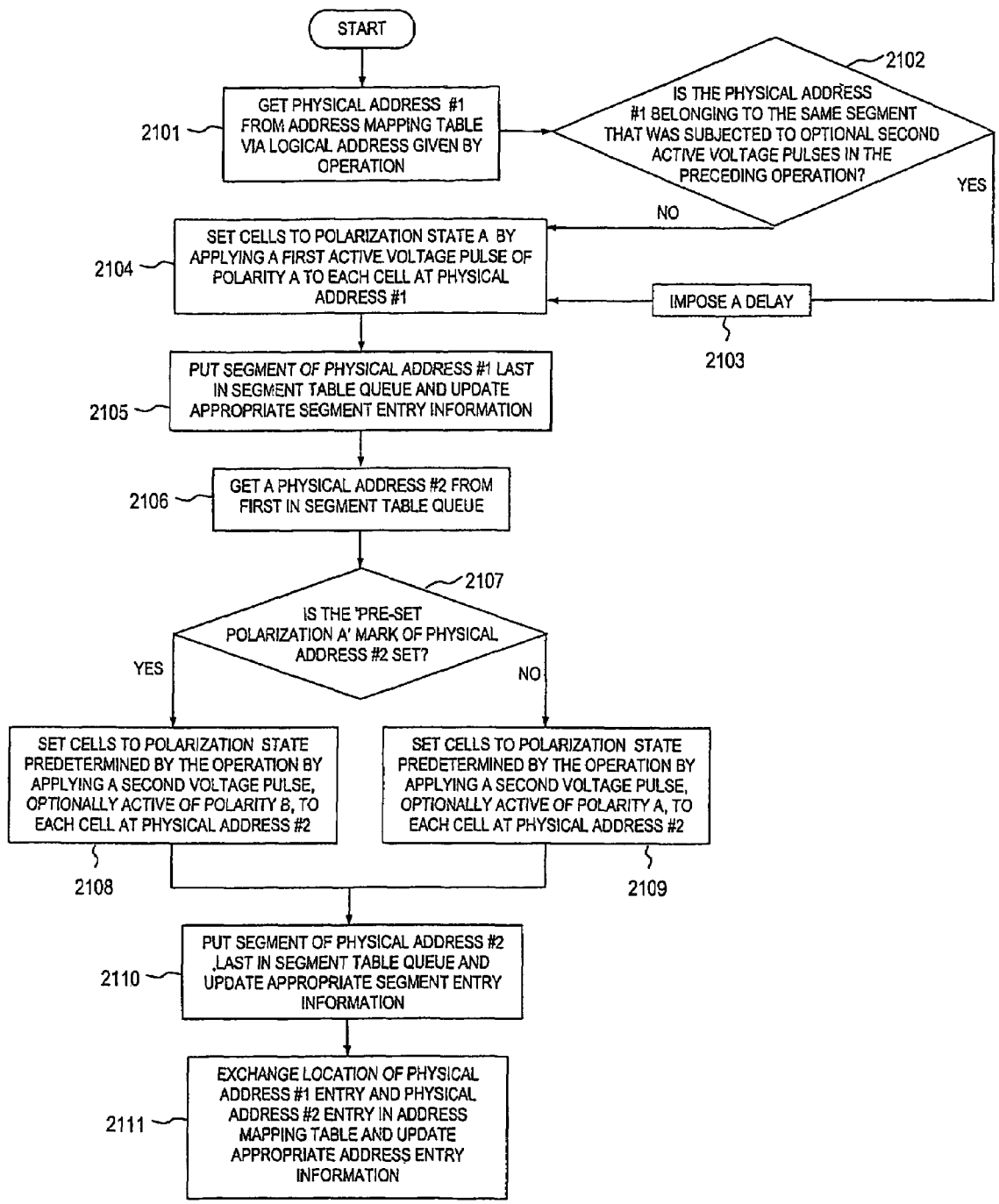

FIG. 16 presents yet another embodiment of the method according to the invention that utilizes addresses to cells that are known to have been pre-set to a first polarization state, for example by previous operations according to the embodiment. This embodiment may be utilized to achieve segment separated active voltage pulses, even within an operation. FIG. 21 in particular shows a I) READ WITH WRITE-BACK, II) WRITE and a III) READ WITH WRITE-DIFFERENT operation. The embodiment in FIG. 16 is implemented using an address mapping table and a segment table as described above. In FIG. 16, operation handling according to the embodiment starts with a first physical address being retrieved in step 1601 from the address mapping table given the logical address of the operation; next, to deal with the previously explained intervals T(D-P1) and T(P2-P1), a delay in steps 1602, 1603 is introduced if the first physical address belongs to the same segment as subjected to the optional second pulse in the preceding operation. The size of the delay needs to be defined with respect to the device implementing the method and will depend on architecture, memory material, number of cells per segment etc. After the third step 1603 each cell at the first physical address is in step 1604 subjected to a first active voltage pulse of polarity A which sets all addressed cells to the same polarization state. A corresponding to the previous mentioned first polarization state; thereafter the segment entry of the first physical address is put last in the segment table queue in step 1605 and appropriate information is updated for the segment entry, which here includes adding the first physical address as an physical address entry since the first physical address now contains pre-set cells, and increasing the 'number of pre-set cell addresses' by one. To find out to which segment a specific physical address belongs to, the segment reference field in the address mapping table may be used or the address will by itself be part of a range that identifies the segment. In the following step 1606 a second physical address for the optional second voltage pulse is retrieved from the first segment entry with an available pre-set cell address entry in the segment table queue, starting with the first segment entry in the queue. Then in step 1607 a second voltage pulse is applied to each of the pre-set cells at the second physical address, setting the cells to polarization states representing binary values according to the operation. After this, is the segment entry of the second physical address put last in the segment table queue in step 1608 and appropriate information is updated for the segment entry, which here includes removing the second physical address and decreasing the 'number of pre-set cell addresses' by one. As a last step 1609 in FIG. 16, the address mapping table is updated by replacing the first physical address with the second physical address, i.e. the logical address given by the operation is now referring to the second physical address instead of the first physical address; hence a new physical address now relates to the logical address and the first physical address contains pre-set cells and is listed in the segment table.

With reference to FIG. 16 now follows descriptions of other operation variants supported within this embodiment:

IV) or V) READ ONCE or ERASE/PRE-SET. For these types of operation variants only the first five steps 1601, 1602, 1603, 1604, 1605 should be executed. In the update of appropriate segment information in the last of those steps 1605, nothing should be updated, i.e. the address will not be put in the segment table even though the address contains pre-set cells after any of these operation variants. The reason for not adding the address to the segment table is explained as follows: Cells pre-set by these operation variants are listed in the address mapping table, the other pre-set cells are not. Listing cells pre-set by these operation variants in the segment table as well, would result in that some, but not all, of the pre-set cell addresses in the segment table would be listed in the address mapping table, which is a situation that is not handled by the other operation variants according to this embodiment. It would also result in an unwanted permanent increase of the total number of pre-set cell addresses listed in the segment table since no other operation variant in this embodiment results in a decrease.

VI) WRITE TO PRE-SET. This operation can and should only be executed on a logical address that has been pre-set by use of a IV or V operation since any other pre-set cells addresses in this embodiment typically are not available via a logical address; a fact that will be exposited later when alternatives are discussed. The steps in FIG. 16 to be executed are the first step 1601, and then three steps may be bypassed. In the next step 1605 the segment of the first physical address should not be put last in segment table queue. Instead only appropriate segment entry information should be updated, which here consists of adding the first physical address as an physical address entry and increasing the 'number of pre-set cell addresses' by one. The following steps 1606-1609 are the same as already accounted for in FIG. 16.

The special steps 1602, 1603 in FIG. 16 to deal with the intervals T(D-P1) and T(P2-P1) are introduced because it cannot be foreseen which physical address a consecutive operation, e.g. a read operation, will involve.

A variant embodiment, based on a slightly changed FIG. 16 embodiment, is provided by introducing in step 1603 a selective size of the delay in FIG. 16, wherein the delay size differs depending on the current operation variant and/or the preceding operation variant and/or the physical address subjected to the preceding operation. For example the operation variant I) READ may require a larger delay than the operation variant II) WRITE etc.

The embodiment presented in FIG. 16 utilizes pre-set cells and creates new pre-set cell addresses each time a pre-set cell address is used for writing data, i.e. the number of pre-set cells will not decrease below the initial amount. The embodiment thus relies on that a certain number of pre-set cells have been created during initialization of the system, implementing the embodiment, and that the physical address of these pre-set cells have been listed in the segment table, but not in the address-mapping table. Below the embodiment that specifically takes care of this, shall be described in more detail, as well as embodiments that handle and maintain the distribution of pre-set cells addresses among the segments.

Figure 17:
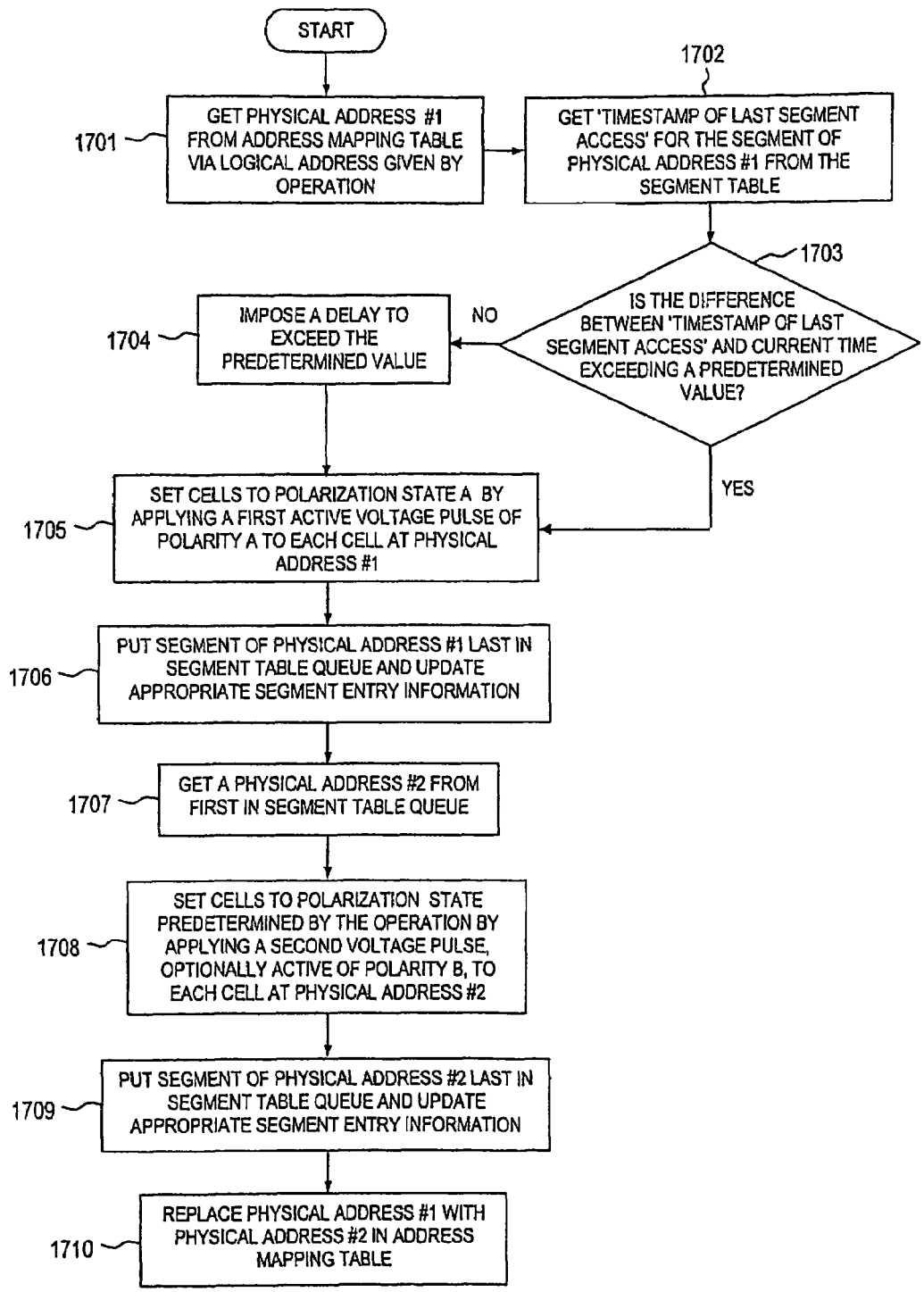

FIG. 17 shows another embodiment of the method according to the invention. Instead of comparing the preceding operation as step 1602 in FIG. 16 and imposing a delay in step 1603 thereof, this embodiment utilizes timestamps in the segment table for better control of the required delay. FIG. 17 in particular shows a I) READ WITH WRITE-BACK, II) WRITE and a III) READ WITH WRITE-DIFFERENT operation. Flow chart steps in FIG. 17, which do not have an identical counterpart in previously described embodiments, will now be described in particular. In the second step 1702 the timestamp of last segment access is read from the segment table entry of the first physical address retrieved in the previous step 1701; the next step 1703 checks if the difference between the timestamp and the present time exceeds a predetermined value or not. The predetermined value should be selected such that the intervals T(D-P1) and T(P2-P1) will be sufficiently large; the predetermined value is typically a constant but it is also possible to use a variable value based on device temperature, switching history etc. If the difference is not exceeding the predetermined value, a delay is imposed in step 1704 such that the predetermined value will be exceeded or reached, typically accomplished by selecting the delay to be the difference between the predetermined value and the difference between the timestamp and current time. In a later step 1706, in connection with the segment entry of the first active voltage pulse being put last in the segment queue, appropriate segment table entry information is updated which includes adding the first physical address as a physical address entry, updating the 'timestamp of last segment access' with current time and increasing the 'number of pre-set cell addresses' with one. In the second last step 1709, when the segment entry of the second voltage pulse is being put last in the segment table queue, the segment table entry information is updated, which includes removing the first physical address as a physical address entry, updating the 'timestamp of last segment access' with current time and decreasing the 'number of pre-set cell addresses' with one.

With reference to FIG. 17 now follows descriptions of other operation variants supported within this embodiment:

IV) or V) READ ONCE or ERASE/PRE-SET. For these types of operation variants only the first six steps 1701-1706 should be executed. Only the 'timestamp of last segment access' should be updated with present time in the update of appropriate segment information in the last of these steps 1706. The reason for not adding the address to the segment table is explained by the following: Cells pre-set by these operation variants are listed in the address mapping table, the other pre-set cells are not. Listing cells pre-set by these operation variants in the segment table as well, would result in that some, but not all, of the pre-set cell addresses in the segment table would be listed in the address mapping table, which is a situation that is not handled by the other operation variants according to this embodiment. It would also result in an unwanted permanent increase of the total number of pre-set cell addresses listed in the segment table since no other operation variant in this embodiment results in a decrease.

VIII) WRITE TO PRE-SET. This operation can and should only be executed on a logical address that has been pre-set by use of a IV or V operation since any other pre-set cells addresses in this embodiment typically are not available via a logical address; a fact that will be exposited later when alternatives are discussed. The steps in FIG. 17 to be executed are the first step 1701, then the four next steps 1702-1705 may be bypassed. In the next step 1706 the segment of the first physical address should not be put last in segment table queue. Instead, only appropriate segment entry information should be updated, which here consists of adding the first physical address as a physical address entry and increasing the 'number of pre-set cell addresses' by one. The following steps 1707-1710 are the same as already accounted for in FIG. 17.

As previously mentioned, it may in some situations be advantageous not to calculate differences in run-time when executing an operation, like for example as in the second and third step 1702, 1703 in FIG. 17, and instead use a parallel mechanism like in FIG. 15 to keep track of the timestamps and set a 'lock state' mark. Use of the 'lock state' mark in execution of an operation is presented in the next embodiment, illustrated by FIG. 18. Something that is not handled in FIG. 16 or 17, but which may occur in rare situations is the case where only very few segments or a single segment contain all pre-set cells, which may result in that a physical address being retrieved from the segment table queue still may be too close in time, i.e. the physical address may belong to a segment that too recently was subjected to a previous operation or an active voltage pulse. A mechanism that can handle such a situation may therefore be needed. An example of such a mechanism is included in embodiment in FIG. 18, using the 'lock state' mark.

Figure 18:
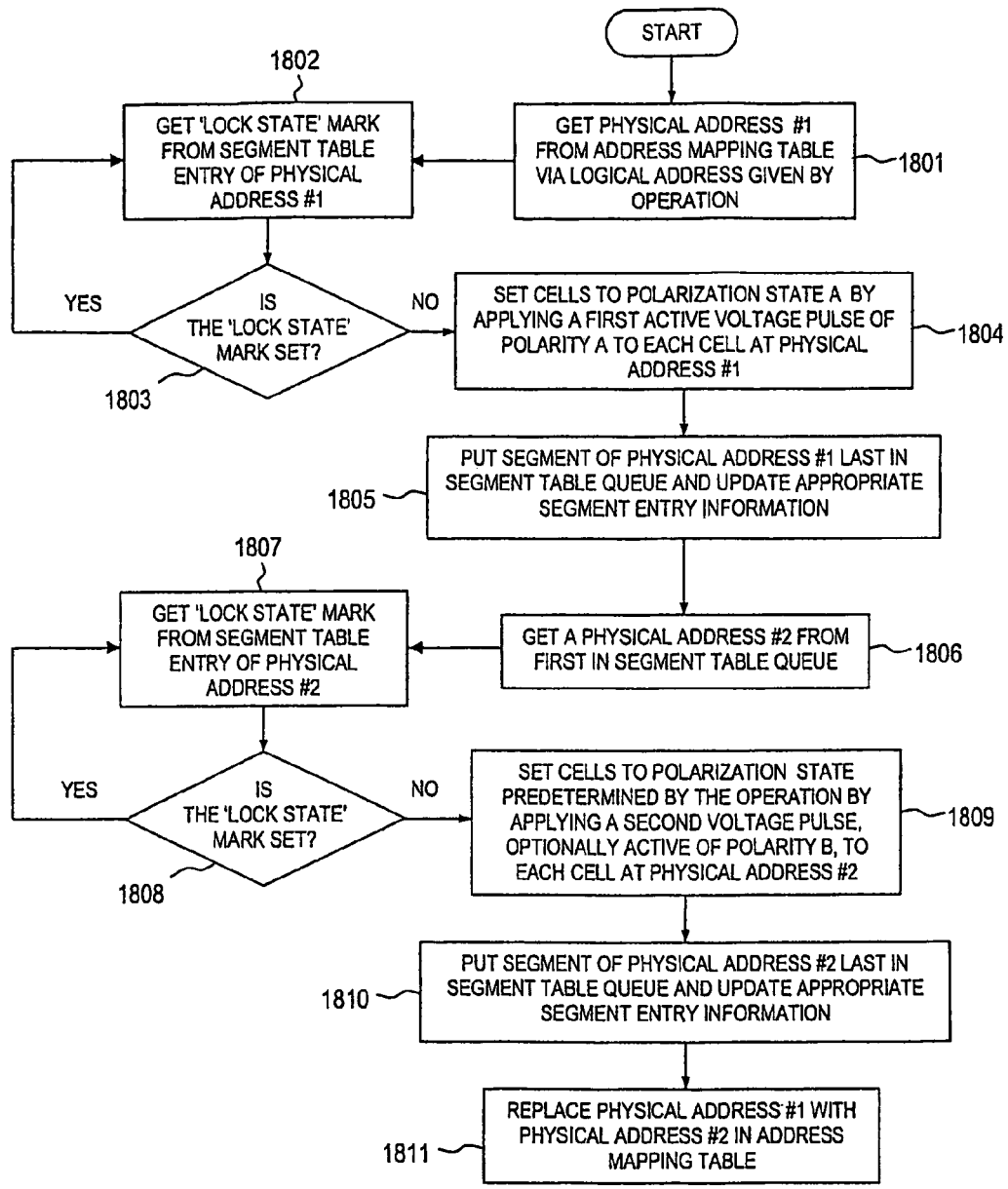

FIG. 18 renders an embodiment taking advantage of a procedure, for instance as previously disclosed in FIG. 15 and which updates a 'lock state' mark. FIG. 18 in particular shows a I) READ WITH WRITE-BACK, II) WRITE and a III) READ WITH WRITE-DIFFERENT operation. The 'lock state' mark is utilized both to replace the use of the timestamp mark in FIG. 17 and to assure that the optional second voltage pulse, even though it is retrieved from the segment table, is not applied too soon in a segment that recently was subjected to an active voltage pulse. Flow chart steps in FIG. 18 that do not have an identical counterpart in previously described embodiments will now be described. In the second step 1802, the 'lock state' mark is read from the segment table entry of the segment containing the first physical address. It is then in step 1803 checked if the read 'lock state' mark is set; in case this mark is set, it is not allowed to apply the first active voltage pulse in the consecutive step; instead the mark is continuously monitored and read in a loop in step 1802, 1803 until the mark has been unset and then the first active voltage pulse is applied in step 1804. In the next step 1805, the update of appropriate segment table entry information includes adding the first physical address as a physical address entry, updating the 'timestamp of last segment access' with present time, setting the 'lock state' mark and increasing the 'number of pre-set cell addresses' by one. In a similar manner as before the application of the first active voltage pulse, the 'lock state' mark is used prior to applying the optional second voltage pulse: The 'lock state' mark is read in step 1807 from the segment table entry of the segment containing the second physical address and it is then in step 1808 checked if the read 'lock state' mark is set. In case the mark is set, the first active voltage pulse in the consecutive step is temporarily blocked, then the mark is continuously monitored and read in a loop in steps 1807, 1808 until the mark has been unset, and in step 1809 the second voltage pulse is applied. In the following steps 1810, 1811, the update of appropriate segment table entry information includes removing the second physical address as a physical address entry, updating the 'timestamp of last segment access' with present time, setting the 'lock state' mark and decreasing the 'number of pre-set cell addresses' by one.

With reference to FIG. 18 now follows descriptions of other operation variants supported within the embodiment:

IV) or V) READ ONCE or ERASE/PRE-SET. For these operation variants only the first five steps 1801-1805 should be executed. In the update of appropriate segment information in the last of those steps, i.e. step 1805, only the 'timestamp of last segment access' should be updated with present time and the 'lock state' mark set. The reason for not adding the address to the segment table is explained as follows. Cells pre-set by these operation variants are listed in the address mapping table, the other pre-set cells are not. Listing cells pre-set by these operation variants in the segment table as well would result in that some, but not all, of the pre-set cell addresses in the segment table would be listed in the address mapping table, which is a situation which is not handled by the other operation variants according to this embodiment. It would also result in an unwanted permanent increase of the total number of pre-set cell addresses listed in the segment table since no other operation variant in this embodiment results in a decrease.

VI) WRITE TO PRE-SET. This operation can and should only be executed on a logical address that is known to have been pre-set by use of a IV or V operation since any other pre-set cells addresses in this embodiment typically are not available via a logical address; a fact that will be exposited later when alternatives are discussed. The steps in FIG. 18 which shall be executed are the first step 1801, then the three next steps 1802-1804 may be bypassed. In the next step 1805, the segment of the first physical address should not be put last in segment table queue. Instead only appropriate segment entry information should be updated; here this comprises adding the first physical address as a physical address entry and increasing the 'number of pre-set cell addresses' by one. The following steps 1806-1811 are the same as already accounted for in FIG. 18.

The use of the 'lock state' mark in steps 1807, 1808 before the application of the second voltage pulse in step 1809 in FIG. 18, could be replaced by using a timestamp mark check similar to the one used before application of the first active voltage pulse in steps 1703, 1704 in FIG. 17, and even by a more rudimentary solution that just performs a check on whether the first active voltage pulse applied in the previous step 1804 did address the same segment as the retrieved second physical address. If that was the case, a delay is imposed before applying the second voltage pulse in step 1809.

Figure 19:
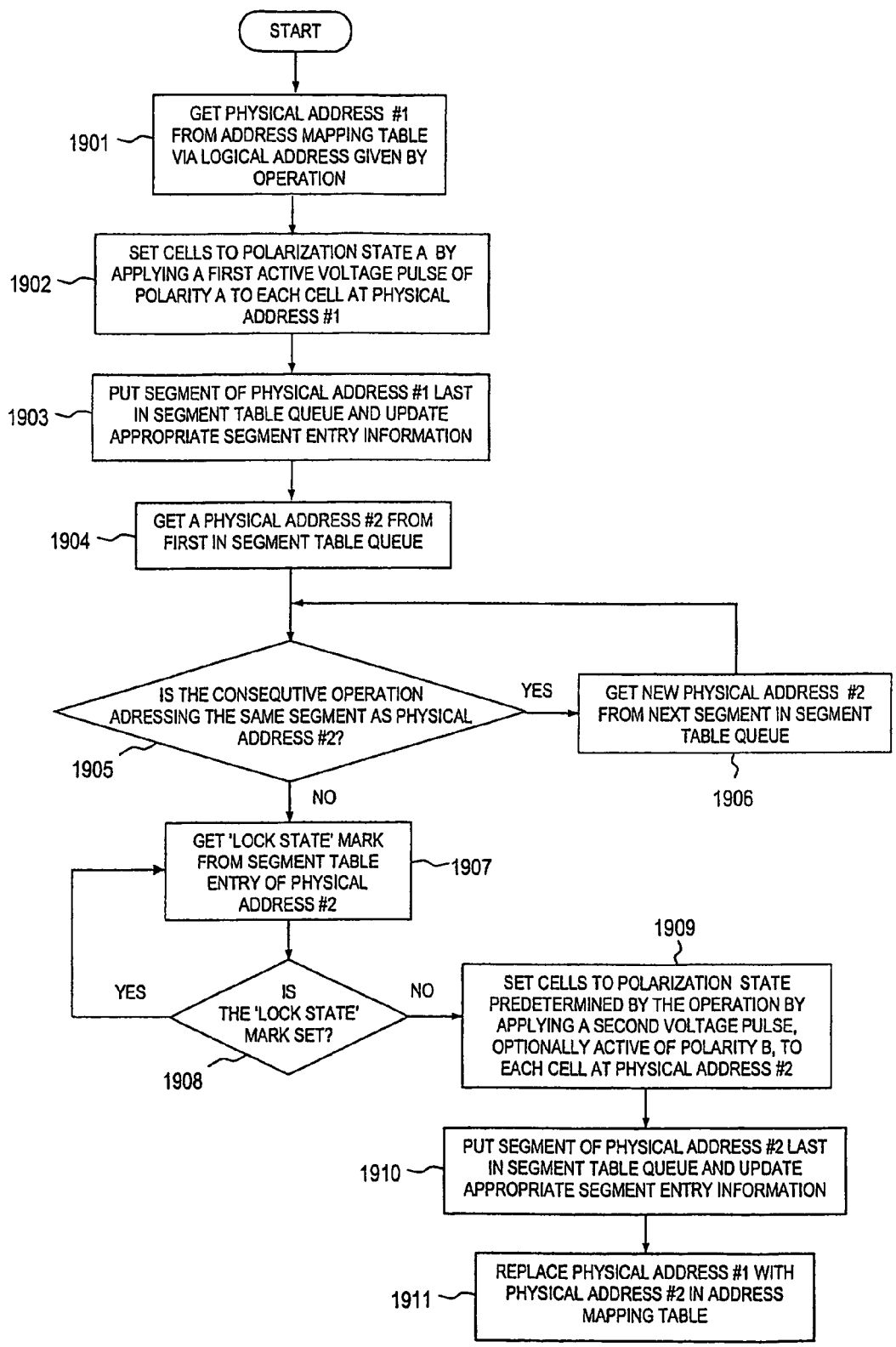

FIG. 19 renders an alternative embodiment dealing with the intervals T(D-P1) and T(P2-P1). FIG. 21 in particular shows a I) READ WITH WRITE-BACK, II) WRITE and a III) READ WITH WRITE-DIFFERENT operation. Instead of comparing with previous addressed operations, the coming operation is analysed before executing the current operation, thereby enabling selection of appropriate segments such that intervals between active voltage pulses in the same segment will be sufficiently large. In FIG. 19 the conditional delay imposed in steps 1802, 1803 in FIG. 18 has been replaced by a check on consecutive operations in steps 1905, 1906. Flow chart steps in FIG. 19 which are not described by an identical counterpart in previously discussed embodiments will now be particularly discussed. In the first update of the segment table in step 1903, the update of appropriate segment entry information involves adding the first physical address as a physical address entry, updating the 'timestamp of last segment access' with present time, setting the 'lock state' mark and increasing the 'number of pre-set cell addresses' by one. After the second physical address has been retrieved, it is checked in step 1905 whether the consecutive operation, i.e. the first physical address of the consecutive operation, is addressing the same segment as the second physical address of the present operation. If that is the case, a new second physical address is retrieved in step 1906 from next segment entry in the segment table queue, i.e. the second first segment entry, and then the check is performed again in step 1905. In case only one consecutive operation is analysed, as in the embodiment of FIG. 19, the check in step 1905 should result in a different answer the second time. Alternative variant embodiments wherein more than one consecutive operation is analysed are possible, which may result in as many loops as given by steps 1905, 1906 as there are consecutive operations being analysed. In the second update of the segment table 1910, the update of appropriate segment entry information includes removing the second physical address as a physical address entry, updating the 'timestamp of last segment access' with present time, setting the 'lock state' mark and decreasing the 'number of pre-set cell addresses' by one.

With reference to FIG. 19 now follows descriptions of other operation variants supported within this embodiment:

IV) or V) READ ONCE or ERASE/PRE-SET. For these operation variants only the first three steps 1901-1903 should be executed. In the update of appropriate segment information in the last of those steps, i.e. 1903, only the 'timestamp of last segment access' should be updated with present time and the 'lock state' mark set. The reason for not adding the address to the segment table is explained as follows. Cells pre-set by these operation variants are listed in the address mapping table, the other pre-set cells are not. Listing cells pre-set by these operation variants in the segment table as well, would result in that some, but not all, of the pre-set cell addresses in the segment table would be listed in the address mapping table, which is a situation which is not handled by the other operation variants according to this embodiment. It would also result in an unwanted permanent increase of the total number of pre-set cell addresses listed in the segment table since no other operation variant in this embodiment results in a decrease.

VI) WRITE TO PRE-SET. This operation can and should only be executed on a logical address that is known to have been pre-set by use of a IV or V operation since any other pre-set cells addresses in this embodiment typically are not available via a logical address; a fact that will be exposited later when alternatives are discussed. The steps in FIG. 19 which shall be executed are the first step 1901, then the next step 1902 may be bypassed. In the third step 1903 the segment of the first physical address should not be put last in segment table queue. Instead only appropriate segment entry information should be updated, which here consists of adding the first physical address as a physical address entry and increasing the 'number of pre-set cell addresses' by one. The following steps 1905-1911 are the same as already accounted for in FIG. 19.

The type of 'pipelining' in FIG. 19 wherein a consecutive operation, or operations, is analysed before executing the current operation, will introduce some latency. In this case this will typically cause no problems since the consecutive operation, or operations, only must be postponed for a very limited period of time. If no consecutive operation or operations occur within that period, the execution of the current operation may continue after the waiting period itself has introduced a sufficient delay.

As aforementioned, the interpretation of which polarization state represents a logic '0' and which represents a logic '1', is only a matter of definition. This is often utilized in devices where the present invention is relevant, for example in connection with conditioning a cell due to the aforementioned imprint effect, something which may involve switching polarization states without changing data. If such a polarization switch results in that the memory cells are left in the opposite polarization state, a so-called "polarity switch" has occurred and consequently the binary interpretation of the polarization states has to change accordingly. This affects the method of the invention as presented in the previous embodiments, since the since application of the optional second voltage pulse therein assumes that the pre-set cells are in the first polarization state A. Since it would be inefficient to first read the pre-set cells to determine polarization state, the information stored in the 'pre-set polarization A' mark in the address mapping table and/or in the segment table should be used instead.

Figure 20:
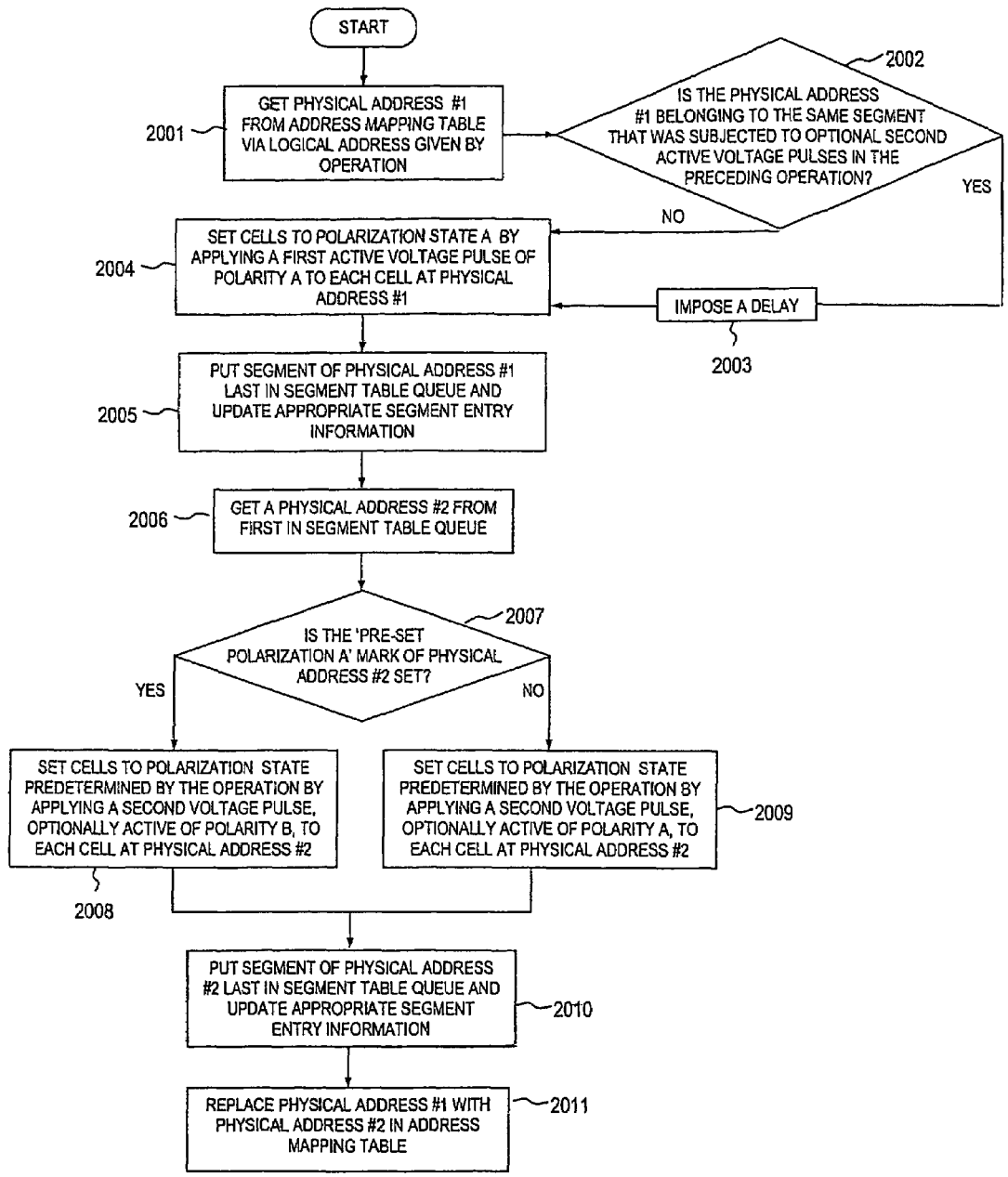

FIG. 20 shows an embodiment of a method according to the present invention which includes pre-set cell handling and deals with a possible polarity switch of pre-set cells for reasons presented above. FIG. 20 in particular shows a I) READ WITH WRITE-BACK, II) WRITE and a III) READ WITH WRITE-DIFFERENT operation. It will now be focused on steps in FIG. 20 that are new and that have not been described in previous embodiments. After application of the first active pulse in step 2004, the segment of the first physical address is put last in the segment table queue in step 2005 and appropriate segment entry information is updated. Here this includes adding the first physical address as a physical address entry with the 'pre-set polarization A' mark set, to indicate that the cells have been pre-set to polarization state A, and increasing the 'number of pre-set cell addresses' by one. After this, a second physical address is retrieved from first position in segment table queue in step 2006, together with any additional information such as the 'pre-set polarization A' mark. Then, prior to the application of the second voltage pulse, there is a check in step 2007 wherein the 'pre-set polarization A' mark of the second physical address is analyzed. If the 'pre-set polarization A' mark indicates polarization state A, a step 2008 follows which is identical to the corresponding step in the previously presented embodiments. If the 'pre-set polarization A' mark does not indicate polarization state A, the polarization state must be B and a different procedure is introduced in step 2009 wherein the second voltage pulse is of polarity A. Pre-setting cells to a polarization state B is achieved by the second active pulse being applied to all cells at the relevant physical addresses in a pre-set operation, and the relevant 'pre-set polarization B' mark being set accordingly in the segment table. In the consecutive step 2010, the update of appropriate segment entry information comprises removing the second physical address as a physical address entry and decreasing the 'number of pre-set cell addresses' by one. It should be noted that the application of the first active voltage pulse in step 2005 occurs independently on the interpretation of polarization state, i.e. cells are always being pre-set to polarization state A. Any procedure handling polarity and used in connection with the present invention will consequently have to pay attention to this and keeping the 'pre-set polarization A' mark updated.

With reference to FIG. 20 now follows descriptions of other operation variants supported within this embodiment.

IV) or V) READ ONCE or ERASE/PRE-SET. For these operation variants only the first five steps 2001-2005 need to be executed. In the update of appropriate segment information in the last of these steps 2005, nothing should be updated. The reason for not adding the address to the segment table is explained as follows: Cells pre-set by these operation variants are listed in the address mapping table, the other pre-set cells are not. Listing cells pre-set by these operation variants in the segment table as well, would result in that some, but not all, of the pre-set cell addresses in the segment table would be listed in the address mapping table, which is a situation that is not handled by the other operation variants according to this embodiment. It would also result in an unwanted permanent increase of the total number of pre-set cell addresses listed in the segment table since no other operation variant in this embodiment results in a decrease.

VI) WRITE TO PRE-SET. This operation can and should only be executed on a logical address that is known to have been pre-set by use of a IV or V operation since any other pre-set cells addresses in this embodiment typically are not available via a logical address; a fact that will be exposited later when alternatives are discussed. The steps in FIG. 20 to be executed are the first step 2001; then the next three steps 2002, 2003, 2004 may be bypassed. In the next step 2005 after the bypass, the segment of the first physical address should not be put last in segment table queue. Instead only appropriate segment entry information should be updated, which here consists of adding the first physical address as an physical address entry and increasing the 'number of pre-set cell addresses' by one. The following steps 2006-2011 are the same as already accounted for in FIG. 20.

In embodiments so far, the last step has involved replacing the first physical address, i.e. the address linked to the logical address given by the operation, with the second physical address in the address mapping table. This results in that the address mapping table only contains physical addresses to data, while physical addresses to pre-set cells are listed only in the segment table. Exceptions are addresses that have been pre-set by the special operation variants IV or V which are listed in the address table just as ordinary data. It is however possible to list pre-set cells both in the address mapping table and in the segment table. As long as pre-set cells are kept invisible to the user, i.e. not represented in the logical address space, the number of initially created pre-set cells may be kept constant which may be an advantage since the invention to a high degree relies on the availability of pre-set cells. On the other hand, if pre-set cell addresses also are listed in the address mapping table it is possible to dynamically increase and decrease the number of pre-set cell addresses in run-time instead of being stuck with the number of pre-set cells initially set up or explicitly set up at any point of configuration. Even in a situation with dynamic pre-set cell addresses in the address mapping table, it will be recommended to set up a certain number of pre-set cells in the initialisation of the system, but that amount does not necessarily have to be kept constant afterwards. In the next embodiment it is shown how the embodiment illustrated by FIG. 20 can be changed to handle storage of pre-set cell addresses in the address mapping table as well as in the segment table.

FIG. 21 illustrates yet another embodiment of a method according to the present invention, and includes pre-set cell handling similar to FIG. 20, which differs in regard of the last step 2111 which concerns interchanging the locations of address entries. In step 2011 the first physical address is replaced by the second, while in step 2111 in F*ig.* 21 the first physical address entry shall change location with the second physical address entry in the address-mapping table. FIG. 21 in particular shows a I) READ WITH WRITE-BACK, II) WRITE and a III) READ WITH WRITE-DIFFERENT operation. Only step 2111 which has no counterpart in FIG. 20 shall now be described. In step 2111 in FIG. 21, the locations of the second and the first physical address are exchanged in the address mapping table instead of replaced as in previous embodiments. This implies that the logical address given by the operation, which was first referring to the first physical address, now instead is referring to the second physical address and that another logical address, which first was referring to the second physical address of pre-set cells, now instead is referring to the first physical address of pre-set cells. Even though the exchange involves changing physical address of a logical address that is not involved in the operation, something which normally is not recommended, the content of the address, i.e. pre-set cells, is still the same and consequently there should be no negative side effect. In the last step 2111, in connection with the physical address exchange, appropriate address entry information in the address mapping table should be updated, which involves setting the 'pre-set' mark and the 'pre set polarization A' mark at the first physical address to indicate that the first physical address now is containing pre-set cells of polarization state A, and unsetting the 'pre-set mark' at the second physical address to indicate that the second physical address no longer contains pre-set cells.

With reference to FIG. 21 now follows descriptions of other operation variants supported within this embodiment.

IV) or V) READ ONCE or ERASE/PRE-SET. For these operation variants only the first five steps 2101-2105 need to be executed. If the address subjected to any of these operation variants should not be stored in the system as a pre-set cell address, nothing needs to be updated in the update of appropriate segment information in the last of these steps 2105. However, if the address should be recognized and it is possible to use as any other pre-set cell address afterwards, the update of appropriate segment information in the last step 2105 should be handled in the same way as described above for ordinary operations, i.e. adding the first physical address as a physical address entry with the 'pre-set polarization A' mark set to indicate that the cells have been pre-set to polarization state A and increasing the 'number of pre-set cell addresses' by one. In addition to this it is also required to add two extra steps: 1) update of address entry information in the address mapping table by setting the 'pre-set' mark and the 'pre-set polarization A' mark, and 2) increase any variable keeping track of the total number of pre-set cell addresses by one. Use of the variable will be explained in connection with the operation variant discussed below.

VI) WRITE TO PRE-SET. This operation variant may be executed on any logical address that is known to store pre-set cells. In FIG. 21, the first step 2101 should be executed, then the next four steps 2102-2105 may be bypassed. The following steps 2106-2111 are the same as described for the ordinary operations. This operation variant will result in that the pre-set cells used for write are not the same as first linked to the logical address given by the operation; further the result will be a decrease of the total number of pre-set cell addresses since no new pre-set cells are created. Consecutive application of this operation variant therefore entails a risk that all pre-set cells in the system are consumed. Since application of the present invention is based on the availability of an adequate number of cells that have been pre-set, this operation variant should not be applied if the total number of pre-set cell addresses is below a certain limit. To be able to keep track of this, a variable storing the total number of pre-set cell addresses can be used. As long as that variable exceeds a predetermined value, application of this, operation variant IV is permitted.

Since this embodiment, as illustrated by FIG. 21 and described above, only may decrease/increase the total number of pre-set cells when using the operation variant IV)-VI), the above-mentioned variable for storing and keeping track of the total number of pre-set cell addresses, only has to be updated when applying the operation variant IV)-VI) of the embodiment provided that the variable initially, when starting to apply the invention according to the embodiment, contains a correct count. The initial count of the variable can be set up at any prior occasion when the number of pre-set cells are known, e.g. at fabrication or later when the device employing the invention is configured or initiated, for example by summing the 'number of pre-set cell addresses' for all segments in the segment table.

Figure 22A:
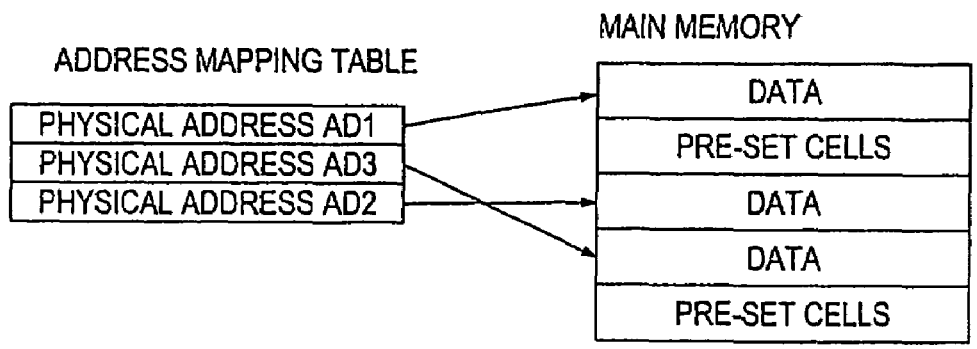
Figure 22B:
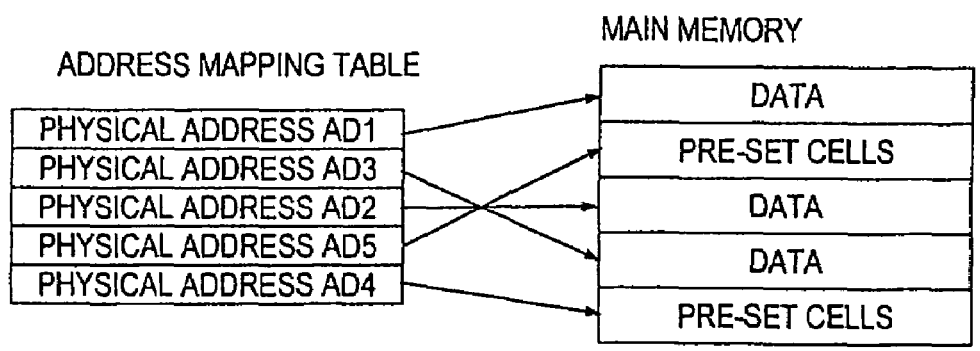

The replacement of physical addresses, like for instance in step 2011 in FIG. 20, instead of exchanging addresses as in step 2111 in FIG. 21, results in system hidden pre-set cell addresses, i.e. the pre-set cells will not be represented by logical addresses, which may be translated into or interpreted as the physical addresses of the pre-set cells not being listed in the address mapping table. The implication of this is illustrated in FIG. 22A, which is to be compared with system visible pre-set cells as shown in FIG. 22B. The main advantage with system visible pre-set cells is the possibility to easily increase the number of pre-set cell addresses, as long there is free memory available. This enables a more dynamic handling of pre-set cells. One risk of only using system visible pre-set cells is that all memory addresses may get allocated by ordinary data; if this happens there will be no available cells to pre-set and the present invention will consequently be of less use. This may however be solved by not allowing the system visible pre-set cells to decrease below a certain value. Nevertheless it may be hard to guarantee this in all situations since the pre-set cells, accessible or not, still are represented by logical addresses and thereby visible to a user. A reservoir of system invisible cells, on the other hand, enables the number of pre-set cells to remain fixed by default, i.e. the number cannot change since there are no logical addresses that make the pre-set cells available for ordinary data access. It should be noted that if the operation variants IV-V are used on an address and there is no update of information concerning pre-set cells in the address mapping table or in the segment table, the system will not know that the address contains pre-set cells after the operation variants, despite that the address has a logical address connected and consequently is system visible according to the definition given above.

One result of the present invention is that pre-set cells will change physical address, something that may cause an uneven distribution of pre-set cells among the segments. Thus, all pre-set cells may end up in a single segment or in very few segments, which may reduce the effect of the present invention. For instance, if all pre-set cells end up in a single segment, the second voltage pulse must be applied in the same segment as the first active voltage pulse. Consequently, there will be a need to introduce a delay between the pulses, as exemplified in the embodiment of FIG. 18, which in turn would negatively affect the data rate. Hence a method according to the invention should support distribution or re-distribution of pre-set cells among the segments, for example when no high-priority operations are ongoing in the memory device, i.e. typically during system idle time.

Figure 23:
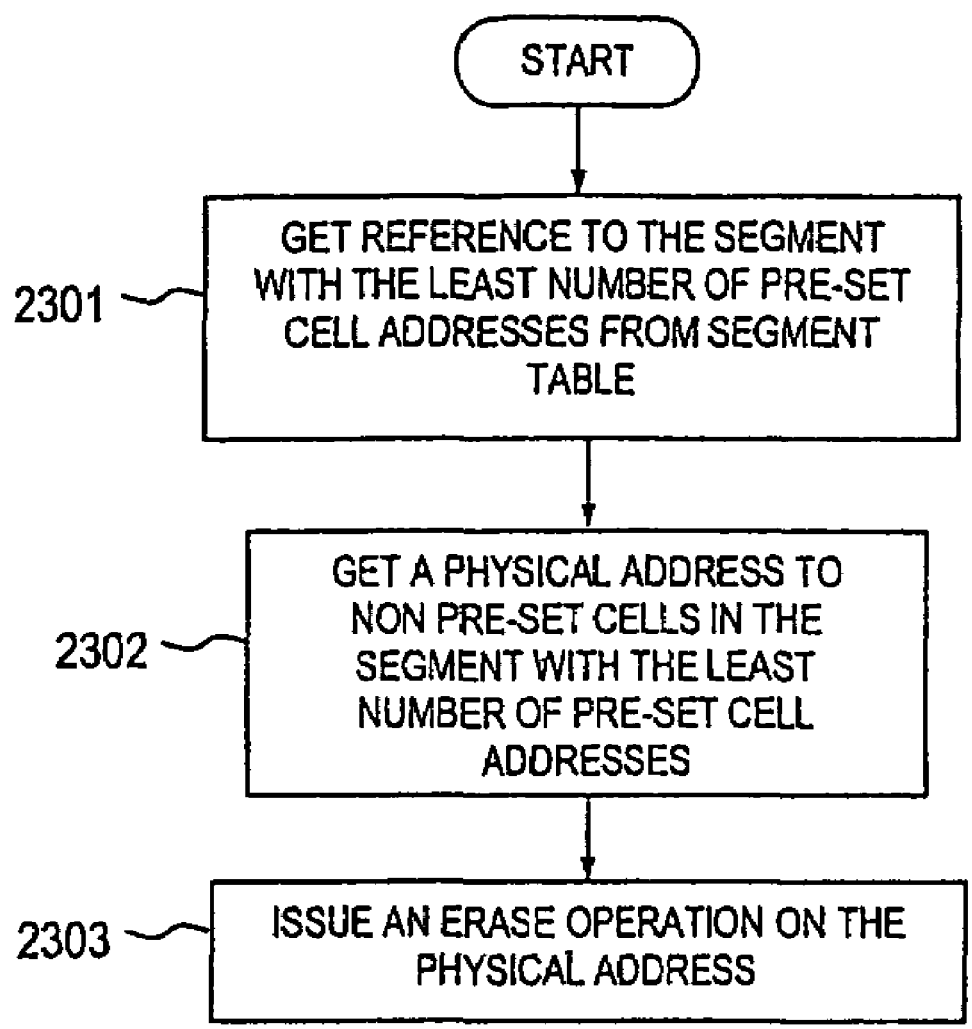

FIG. 23 shows an embodiment of the method according to the present invention, which handles distribution of pre-set cells during system idle time. First a reference is retrieved in step 2301 to the segment with the least number of pre-set cells, using the segment table additional information on 'number of pre-set cell addresses'. The range of physical addresses belonging to a given segment is either known by default, cf. the alternative to segment reference filed in the segment table as discussed previously in connection with FIG. 12, or there is an explicit segment reference available in the address mapping table. This is utilized in the next step 2302 wherein a physical address to non pre-set cells is picked in the segment with the least number of pre-set cells; then an erase/pre-set operation is issued in step 2303 on the retrieved first physical address. According to previous embodiments an operation is issued on a logical address, but in this case the first step of getting the first physical address via a logical address may be bypassed, as for example bypassing the first step 2001 in FIG. 20, and instead directly use a physical address if such is available, starting directly in the second step 2002, or do the similar in any other embodiment handling execution of operations. The possibility to apply an operation directly on a physical address, when such is available, is utilized in the last step 2303 where it is implicitly assumed that the used erase operation supports execution using physical addresses directly. However, if it is not possible or desirable to allow an operation directly on a physical address, it is also possible with an alternative embodiment, similar to that in FIG. 23, but wherein the logical address is retrieved via the address mapping table after the second step 2302. The erase operation is then issued using the logical address, even though a retrieval of the physical address back from the address mapping table would be the first thing to take place in the execution of the operation.

Since a read operation issued on an address in a segment will result in creation of pre-set cells in said segment and change of location of read data to another segment, repeated application of the method presented in FIG. 23 will result in a trend towards an even distribution of pre-set cells.

The method of distributing pre-set cells, as illustrated in FIG. 23 and as presented above, is suitable both with system visible pre-set cells as well as with system invisible pre-set cells. It does not, however, support creation of additional pre-set cells, and the number of system invisible pre-set cells will therefore typically remain stable, corresponding to the number of cells created and pre-set in the manufacturing phase and/or during initialisation/configuration of the system. The system invisible pre-set cells typically are initially created by reserving certain physical addresses, typically a range, in each segment and pre-set the cells at those physical addresses to the same polarization state by applying a single polarity active voltage pulse to each of the cells, and not list said physical addresses in the address mapping table. During initialization and/or creation of such a system it is of course also possible to create additional system visible pre-set cells. Creation of system visible pre-set cells may however not only take place during creation or initialization of the system, but may as well be taken care of during idle time when no operations are ongoing or imminent and/or in combination with distributing pre-set cells among the segments.

Figure 24:
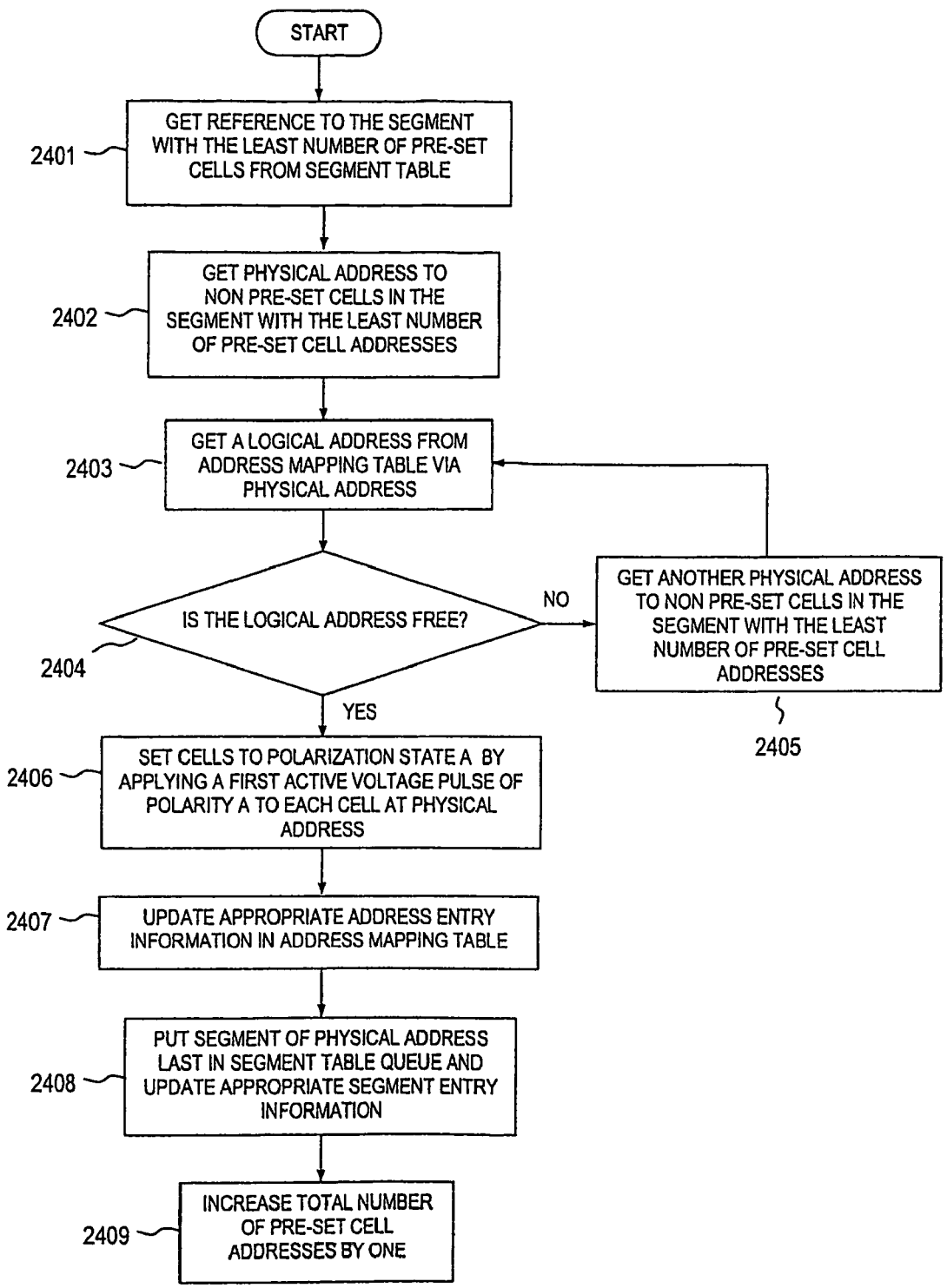

FIG. 24 presents another embodiment of the method according to the present invention that supports creation and distribution of pre-set cells during idle time. The first steps 2401, 2402 are identical to FIG. 23, but then in step 2403 the logical address corresponding to the first physical address is retrieved from the address mapping table. The reason for this is the following step 2404 wherein it is checked if the non-pre set address is 'free'. This is to be interpreted as an address containing disposable data, i.e. a memory address is part of what normally is denominated 'free memory'. Keeping track of available 'free memory' addresses is an issue well known in prior art and it will not be discussed in detail herein. It will be considered apparent to those skilled in the art of managing memories how to keep track of and get references to 'free memory' addresses such that data allocated by the system are not destroyed, e.g. by being accidentally written over. Normally high level memory management is taken care of in the logical address space, which is the reason for the third step 2403 described above. However, in a system where it is possible to get information on free memory addresses directly in the physical address space this step 2403 is unnecessary and the check in step 2404 could be performed directly on the physical address. Still referring to FIG. 24; if the check in step 2404 results in the address not being 'free', another first physical address to non-pre set cells is retrieved in step 2405; then the loop generated by steps 2404, 2405 is repeated until a 'free' address is found. After this each cell at the physical address is subjected to a first active voltage pulse of polarity A which sets all addressed cells to the same polarization state. In the next step 2407, appropriate address entry information is updated in the address mapping table; which type of address entry information that shall be updated depends on the specific method used for executing the operations. Any information that is in use by such a method should of course be updated, i.e. the update may include setting the 'pre-set' mark and the 'pre-set polarization A' mark for the physical address. In the next step 2408 the segment of the physical address is put last in the segment table queue (2408) and in connection with this, the physical address is added as an entry in the segment table and appropriate segment entry information is updated, which includes increasing the 'number of pre-set cell addresses' by one. Possible additional segment entry information to be updated depends on the specific method in use for executing the operations; any information that is in use by such a method should of course be updated, i.e. the update may further include updating the 'timestamp of last segment access' with current time, setting the 'lock state' mark and setting the 'pre-set polarization A' mark for the physical address entry. The variable containing the total number of pre-set cell addresses is increased by one in the last step 2409, which only has to be done in case that variable is used by any method for executing the operation, e.g. operation variants IV), V) or VI) in the previous description of the embodiment in FIG. 21. The variable is also used in the embodiment illustrated in FIG. 26 and described below.

As long as there are 'free' memory addresses in the segment with the least number of pre-set cells, the embodiment described in FIG. 24 will, besides creating new pre-set cells, support a trend towards an equal number of pre-set cell addresses in each of the segments.

With the use of system visible pre-set cells, and especially if a large number of such cells are created during idle time, it will often be possible to use a special variant of operation VI) according to previous embodiments, i.e. write to pre-set cells directly. Such an operation is potentially twice as fast as an ordinary write operation since execution only may involve application of one active voltage pulse. However, instead of the user being required to actively select an operation type VI it would clearly be better if the same effect could be achieved automatically. Embodiments that exemplify such solutions to further increase data rate will now be presented.

Figure 25:
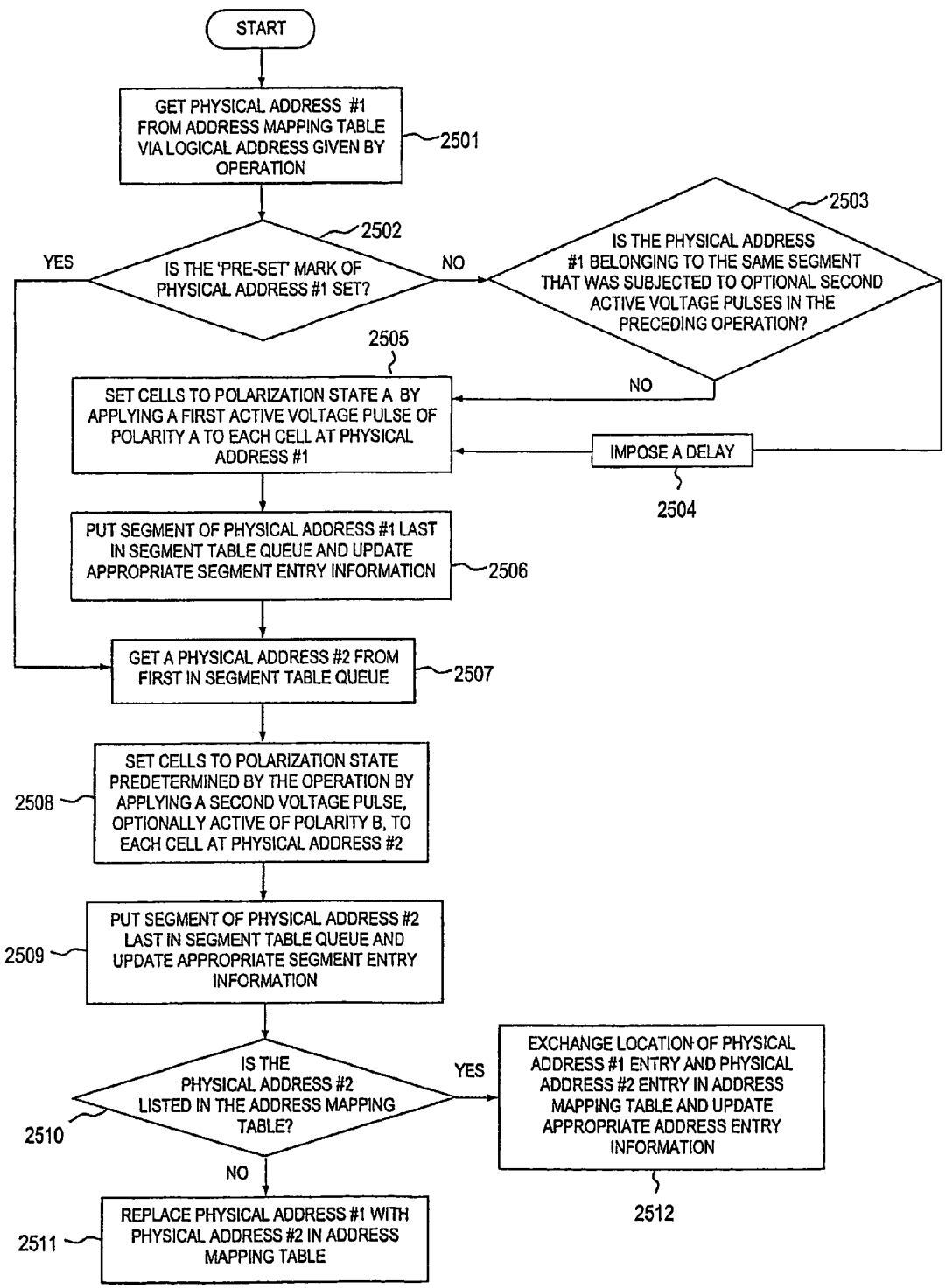

FIG. 25 gives example of a preferred embodiment of a method according to the invention that takes advantage of system visible pre-set cells in addition to system invisible pre-set cells, i.e. both system visible and system invisible pre-set cells are used. FIG. 25 in particular shows a I) READ WITH WRITE-BACK, II) WRITE and a III) READ WITH WRITE-DIFFERENT operation. For purpose of convenient presentation, steps handling polarity switch from previous embodiments, e.g. as in FIG. 20, steps 2007, 2008, 2009, have been removed in FIG. 25; further the following description shall only in detail describe steps without an identical counterpart in previously presented embodiments and figures. With reference to FIG. 25 it is after the first step 2501 checked in step 2502 if the 'pre-set' mark of the first physical address is set. If pre-set cells are found already at the first physical address, there is no need to apply the first active voltage pulse, and steps 2503, 2504, 2505, 2506 will be bypassed. Instead the second physical address is retrieved directly in step 2507 from first position in the segment table queue. If the check in step 2502 shows an unset 'pre-set' mark, the consecutive steps 2503, 2504, 2505, 2506, 2507, 2508, 2509 are carried out in accordance with previously presented embodiments. It is then checked in step 2510 whether the second physical address has an entry in the address mapping table, something that would indicate that the pre-set cells at the second physical address are system visible. In case of system visible cells are found at the second physical address, the location of the first physical address entry and second physical entry in the address mapping table are exchanged in step 2511 and additional information set in accordance with the similar step in FIG. 21. In case system invisible cells are found at the second physical address, the first physical address in the address mapping table is replaced with the second physical address in step 2512, similar as for instance step 2011 in FIG. 20. One result from the selective handling in steps 2510, 2511, 2512 is that a fixed number of system invisible pre-set cells may be maintained while still supporting system visible cells.

With reference to FIG. 25 now follows descriptions of other operation variants supported within this embodiment.

IV) or V) READ ONCE or ERASE/PRE-SET. For these operation variants only the first six steps 2501-2506 need to be executed. If the address subjected to any of these operation variants should not be stored in the system as a pre-set cell address, nothing needs to be updated in the update of appropriate segment information in the last of these steps 2506. However, if the address should be recognized and possible to use as any other pre-set cell address afterwards, the update of appropriate segment information in the last step 2506 should be handled in the same way as described above for ordinary operations, i.e. adding the first physical address as a physical address entry with the 'pre-set polarization A' mark set to indicate that the cells have been pre-set to polarization state A and increasing the 'number of pre-set cell addresses' by one. In addition to this it is also required to update address entry information in the address mapping table by setting the 'pre-set' mark and the 'pre-set polarization A' mark for the first physical address.

VI) WRITE TO PRE-SET. Because of the second step 2502 in FIG. 25, handling of this operation variant is already included, i.e. there is no need for an explicit write to pre-set operation.

An effect similar to the one achieved in the previous embodiment and that of FIG. 25, i.e. quick write operations, may also be achieved by using system visible pre-set cells only, provided that not all pre-set cells are allowed to be consumed, i.e. there should always be a minimum number of pre-set cells available. A variable containing the total number of pre-set cell addresses may be used to control that the total number of pre-set cells does not decrease below a certain limit, like for example the variable mentioned for storing the total number of pre-set cell addresses as presented in the embodiment described in connection with FIG. 21. Similar to the address mapping table and segment table, the variable can be defined in software used in the device controlling/managing the passive matrix-addressable memory and stored in a small RAM or similar memory, or the variable can be defined on a lower, more hardware oriented level and stored in for example a register. As mentioned above, the variable has to initially be set to store the total number of pre-set cell addresses and then the variable must be updated in correspondence with any mechanism or method that changes the number of available pre-set cells.

It will now be presented an embodiment that uses system visible pre-set cells only and that utilizes consumption of pre-set cells to enable quick write operations. Further consumption of pre-set cell addresses is not allowed if the total number of pre-set cell addresses falls below a predetermined value.

Figure 26:
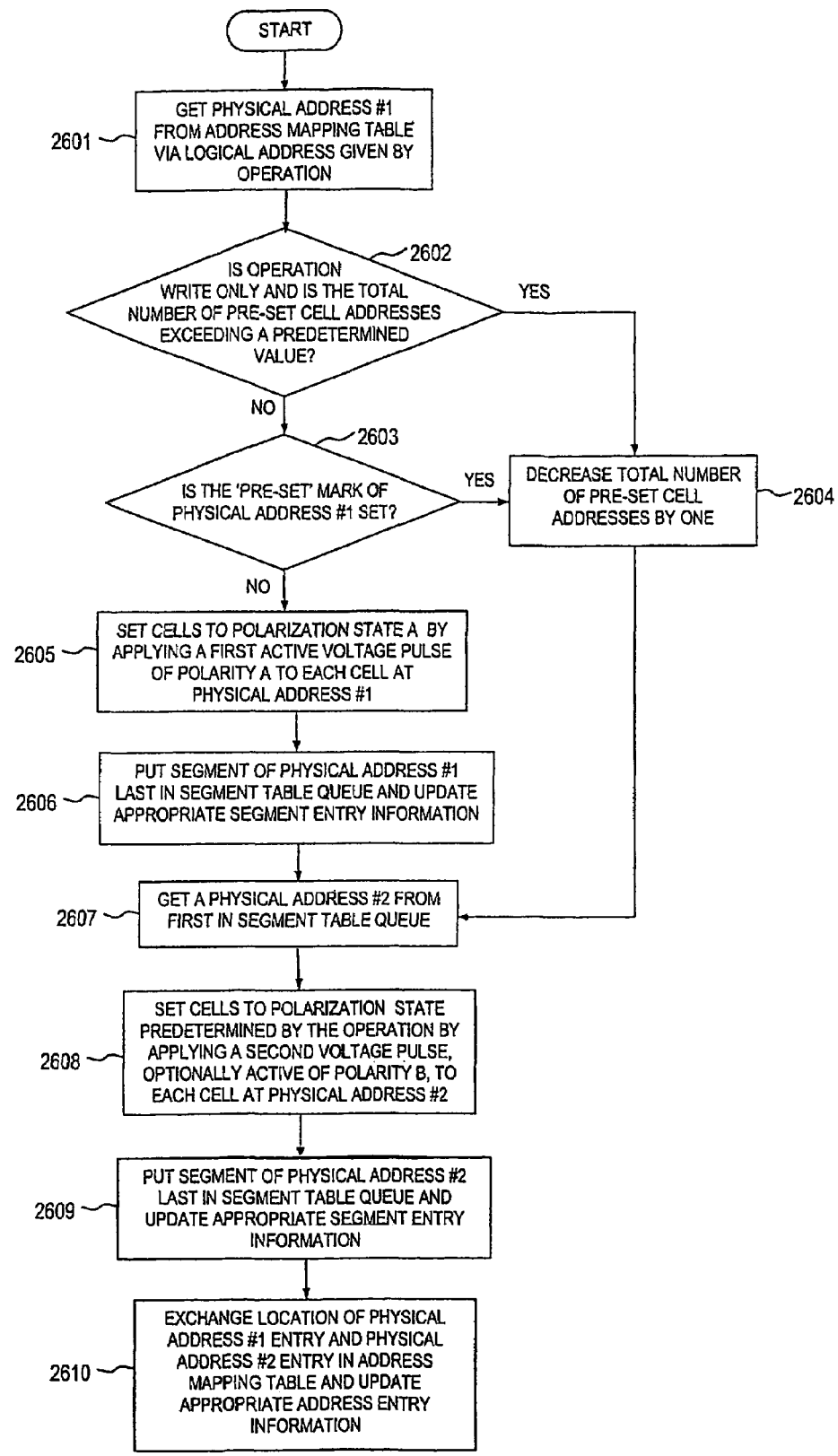

FIG. 26 provides an illustration of an embodiment of a method according to the present invention that utilizes consumption of pre-set cells and which only uses system visible pre-set cells. FIG. 26 in particular shows a I) READ WITH WRITE-BACK, II) WRITE and a III) READ WITH WRITE-DIFFERENT operation. For the purpose of convenient presentation, steps handling polarity switch from previous embodiments, e.g. as in steps 2107, 2108, 2109 in FIG. 21 have been removed in FIG. 26. Further, the following description shall only in detail describe steps without an identical counterpart in previously presented embodiments and figures. In the first steps 2602, 2603 in FIG. 26 it is checked for the possibility to skip the application of the first active voltage pulse to save time and thereby attain higher data rates. In the second step 2602 of FIG. 26 it is checked if the operation is write only, i.e. operation variant II, and if the total number of pre-set cells exceeds a predetermined value, the total number of pre-set cell addresses is decreased by one in step 2604 and the first active voltage pulse may be bypassed. The next step 2607 then involves getting a second physical address from first location in the segment table, but if the check in the second step 2602 indicates a non-write only operation, and/or a non-exceeded predetermined value, the first active voltage pulse may still not need to be applied if the check in the third step 2603 shows that the first physical address already contains pre-set cells. If that is the case, i.e. pre-set cells at the first physical address, the total number of pre-set cells should be decreased by one in step 2604. The next step 2607 then involves retrieving the second physical address. If it is not allowed not to apply the first active voltage pulse, the fifth and sixth steps 2605, 2606 in FIG. 26 are executed. The update of appropriate segment entry information in the last of these steps 2606 comprises adding the first physical address as a physical address entry with the 'pre-set polarization A' mark set to indicate that the cells have been pre-set to polarization state A, and increasing the 'number of pre-set cell addresses' by one. The four last steps 2607-2610 in FIG. 26, except for the last step 2610, are in accordance with corresponding steps in the description of FIG. 21. However, the last step 2610 needs to be more selective in updating the appropriate address entry information. It cannot, for example as in the description of FIG. 21, be assumed that the first physical address contains pre-set cells, since that depends on the result from the check in the previous step 2602. Therefore, when updating the address entry information of the first physical address in the address mapping table 2610, it should first be checked if the 'pre-set' mark already is set for the first physical address and if that is the case, the 'pre-set polarization A' mark should be set as well, i.e. same update handling as previously. But, if the 'pre-set' mark is not set at the first physical address, it should be made sure that the 'pre-set' mark stays unset for the first physical address entry in the address mapping table. The second physical address entry will not contain pre-set cells when reaching the last step 2610 and the update of appropriate address entry information in said step should as previously unset the 'pre-set' mark of the second physical address entry in the address mapping table.

With reference to FIG. 26 now follows descriptions of other operation variants supported within the embodiment:

IV) or V) READ ONCE or ERASE/PRE-SET. These operation variants should only be executed on non pre-set cell addresses. Only the first steps 2601-2606 involving the first physical address need to be executed. If the address subjected to any of these operation variants should not be stored in the system as a pre-set cell address, nothing needs to be updated in the update of appropriate segment information in the last of these steps 2606. However, if the address should be recognized and possible to use as any other pre-set cell address afterwards, the update of appropriate segment information in the last step 2606 should be handled in the same way as described above for ordinary operations, i.e. adding the first physical address as a physical address entry with the 'pre-set polarization A' mark set to indicate that the cells have been pre-set to polarization state A and increasing the 'number of pre-set cell addresses' by one. In addition to this it is also required to add two extra steps, viz. 1) update of address entry information in the address mapping table by setting the 'pre-set' mark and the 'pre-set polarization A' mark, and 2) increase any variable keeping track of the total number of pre-set cell addresses by one.

VI) WRITE TO PRE-SET. Because of the second step 2602 in FIG. 26, handling of this operation variant is already included, i.e. there is no need for an explicit write to pre-set operation.

Figure 27:
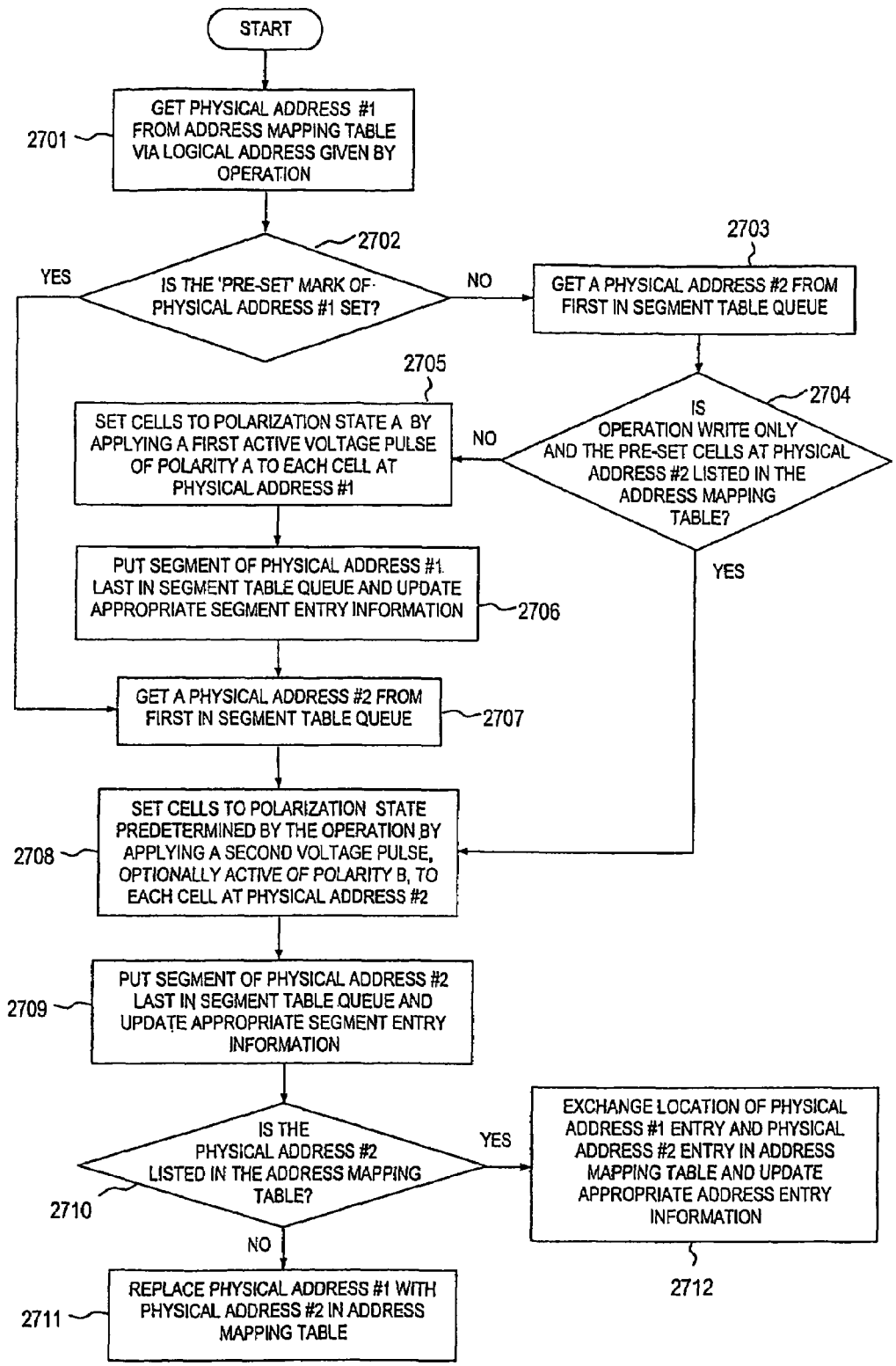

FIG. 27 shows yet another embodiment of a method according to the present invention, which takes advantage of a dynamic number of system visible pre-set cells together with a fixed number of system invisible pre-set cells. To achieve higher operational data rate for write operations the embodiment in FIG. 27 utilizes the fact that system visible pre-set cells may be consumed and decrease in amount. FIG. 27 in particular shows I) READ WITH WRITE-BACK, II) WRITE and III) READ WITH WRITE-DIFFERENT operations. Basically FIG. 27 is a superset of the embodiment presented in FIG. 26 except for steps 2602 and 2604, the counterparts of which are excluded in FIG. 27 for purpose of convenient presentation. Hence there shall now only be focused on distinguishing steps: If the check of the 'pre-set' mark in the second step 2702 results in an unset mark, i.e. non pre-set cells are found at the first physical address, a second physical address is retrieved in step 2703 from first position in the segment table queue 2703. In the next step 2704 it is checked if the current operation is a write operation and if the second physical address is listed in the address mapping table, i.e. system visible. If this is not true, the continuation is identical to corresponding steps in FIG. 25, but in case the operation is a write operation and if the pre-set cells at the second physical address are system visible, some steps 2705, 2706, 2707 may be bypassed and application of the second voltage pulse in step 2708 may directly follow. Note that if a second physical address needs to be retrieved twice in step 2703, 2707, it is the latest retrieved second physical address that will be used in the consecutive steps 2708, 2709, 2710, 2711, 2712. The last steps 2709, 2710, 2711, 2712 in FIG. 27 are identical to those presented in steps 2509, 2510, 2511, 2512 in FIG. 25, except from the last step 2712, wherein it cannot be assumed that the fist physical address contains pre-set cells in the update of appropriate address entry information. Instead the update should be handled in correspondence with the description of the corresponding step 2610 in FIG. 26.

The introduced additional check in step 2704 in FIG. 27 will not only make it possible to bypass time-consuming steps in case of system visible pre-set cells being found at the first physical address, e.g. when a write operation is issued on a 'free' address that have been pre-set during idle times, but also in case of system visible pre-set cells being found at the second physical address in a write operation. It was previously stated as advantageous to implement the address lists per segment as queues, which in the context of this embodiment benefits from some adjustments. All system visible pre-set cell addresses should get priority in the queue and be put ahead of all system invisible pre-set cell addresses in the queue. The result is that system visible pre-set cell addresses are the first to be retrieved from the segment entry in the segment table, and the system invisible cells will only be used after the system visible pre-set cell addresses have been consumed for the segment. This makes the embodiment in FIG. 27 more efficient since consecutive applications of the second voltage pulse to a segment first will be made to system visible pre-set cell addresses, which in turn will enable more frequent bypasses of time consuming steps via the check in step 2704 on system visible pre-set cells at the second physical address.

With reference to FIG. 27 now follows descriptions of other operation variants supported within the embodiment:

IV) or V) READ ONCE or ERASE/PRE-SET. These operation variants should only be executed on non-pre-set cell addresses, in case these operation variants are used on an address containing pre-set cells, nothing should, and needs, to be executed in the flow chart on FIG. 27. For use on a non pre-set cell address, there should be no involvement of a second physical address, i.e. the third and fourth step 2703, 2704 should be bypassed and directly after the second step 2702, the fifth step 2705 should be applied and thereafter the sixth step 2706 which for this operation variant is the last step. If the address subjected to any of these operation variants should not be stored in the system as a pre-set cell address, nothing needs to be updated in the update of appropriate segment information in the last of these steps 2706. However, if the address should be recognized and possible to use as any other pre-set cell address afterwards, the update of appropriate segment information in the last step 2706 should be handled in the same way as described above for ordinary operations, i.e. adding the first physical address as a physical address entry with the 'pre-set polarization A' mark set to indicate that the cells have been pre-set to polarization state A and increasing the 'number of pre-set cell addresses' by one. In addition to this it is also required to update address entry information in the address mapping table by setting the 'pre-set' mark and the 'pre-set polarization A' mark.

VI) WRITE TO PRE-SET. Because of the second step 2702 in FIG. 27, handling of this operation variant is already included, i.e. there is no need for an explicit write to pre-set operation.

A buffer of system visible pre-set cells may be created during system idle time for example according to the previously described embodiment in FIG. 24. The buffer can be utilized to approximately double the data rate at write operations according to the embodiments in FIG. 25 or FIG. 27. The same effect may also be achieved by the embodiment described in connection with FIG. 26 which only operates using system visible pre-set cells, i.e. when using this embodiment there is no need to first distribute system invisible pre-set cells like in FIG. 23. Instead new system visible pre-set cells may be created during idle time for example according to FIG. 24. It is also possible that the user when reading the memory creates new pre-set cells by e.g. using the operation variant IV in the embodiment in FIG. 26 embodiment, or that the user actively has to use the operation variant V during idle times to create more pre-set cells in case the number of available pre-set cell addresses falls below a certain value, or can be predicted to do so.

In a system with idle time periods approximately of the same size or larger than run time periods and wherein the available free memory at the start of the idle period is approximately the same as or equal to the size of data to be written during the consecutive run time period, the prospect of obtaining substantially twice the data rate for all write operations is particularly good, even in the extreme case of a period of only write operations. "Twice" the data rate is here compared to a case where an operation consists of two active voltage pulses and thereby has approximately the double total pulse length.

In case of long run-time periods with no or too short idle times, there is a risk of an uneven distribution of pre-set cells among the segments. However, even in a case wherein all system visible pre-set cells would be consumed and all system invisible pre-set cells would end up in a single segment, the method of the invention may still improve the performance for every operation not addressing the segment holding all the pre-set cells. In the absolute worst case without any idle times, no system-visible pre-set cells, all pre-set cells in the same segment and with all operations addressing the segment, the data rate shall at least match that obtainable without applying the present invention. In other words, applying the method of the present invention shall not in any case be detrimental for the data rate.

Figure 28:
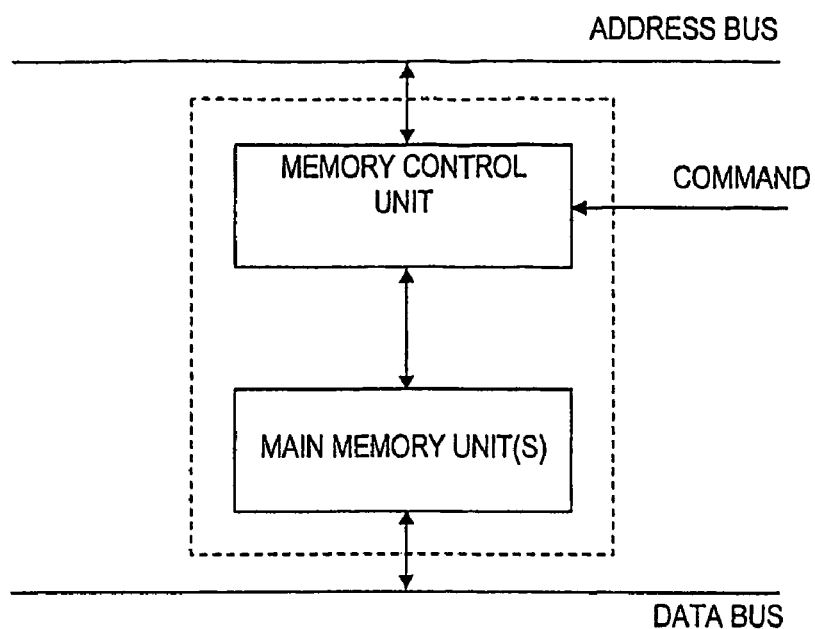

An example of a device that implements method according to the present invention is illustrated in FIG. 28. The device is divided into two distinct parts, viz. the normal passive matrix addressable main memory and a memory control unit. The control unit interprets operations scheduled for the memory and translates high-level operations on logical addresses, e.g. write a word X at a logical address Y, to low-level pulse protocol instructions on physical addresses that can be understood and handled by the main memory part. An operation is scheduled to the memory by the operation issuer, typically the system, or part of the system employing the device, by sending a command to the memory control unit, e.g. WRITE. Typically the operation is part of a software program. The operation issuer also has to make the address to be written available on the address bus and the data to be written available on the data bus. After the command has been received, the memory control unit gets the logical address to use in execution of the write operation from the address bus. The memory control unit then uses the address mapping table to get a physical address etc. according to any of the previously described embodiments. The data to be written are retrieved by the main memory directly from the data bus. When the memory control unit has taken appropriate actions and the data have been written to the logical address, the operation has been accomplished. As indicated by the dotted line, the two parts, memory control unit and main memory, may not need to be physically separated, like for example in two different integrated circuits, but could as well be integrated in the same unit. For some situations it may, however, be advantageous with separate units since this facilitates that one memory control unit may control more than one physical unit of main memory at the same time, i.e. one logical memory space being among two or more main memory units.

Figure 29:
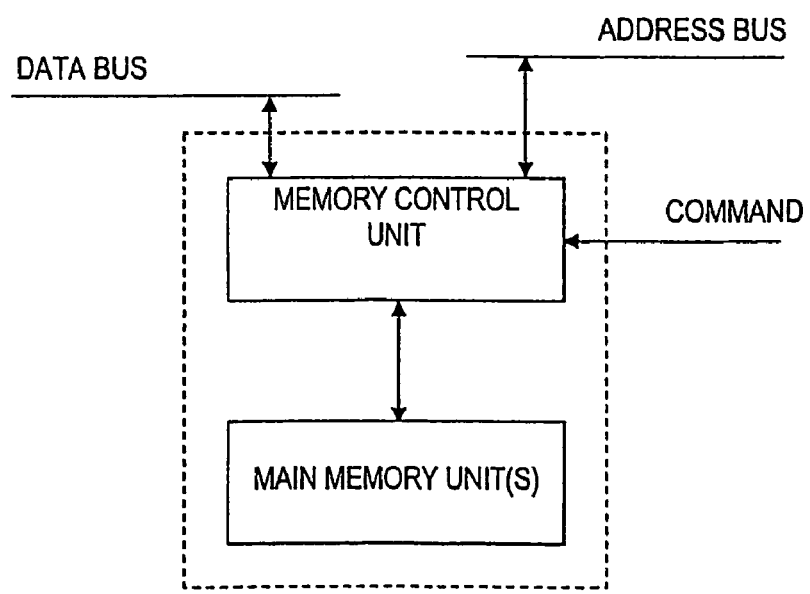

Another embodiment of the device that implements the method according to the present invention is illustrated in FIG. 29, wherein the main difference compared to FIG. 28 is that the main memory passes the data via the memory control unit, i.e. the main memory or the main memory units only interface the memory control unit, which in turn handles all communications with the rest of the system employing the device. One benefit with this solution is scalability; it will typically be easier in a system to have one static interface to a memory wherein any exchange, increase, decrease etc. of memory units is taken care of by the memory control unit and only indirectly will influence the rest of the system.

To be as efficient as possible, the number of system invisible pre-set cells and/or system visible pre-set cells and/or allowed minimum number of total available pre-set cell addresses for a system applying the present invention should be selected and set up based on the size of the memory, usage of the memory, number of segments etc.

In order to optimize the performance of a given memory device according to the present invention the ratio of visible to invisible pre-set cells may be selected according to how the device is or will be operated. For example, the following modes of operation may be of particular interest:

In a memory with an approximately equal number of read and write accesses, i.e. with a relatively large number of write operations compared to a typical memory situation, it may be advantageous to support a large number of system visible pre-set cells instead of a large number of system invisible pre-set cells. Accordingly, the system may be designed such that during an average idle time period, half of the time shall be spent on distributing system invisible pre-set cells among the segments and the other half on creating system visible pre-set cells in the segments. Alternatively, if only system visible pre-set cells are used it may be advantageous to allow a relatively small number of remaining available pre-set cell addresses before prohibiting any further decrease of the total number of pre-set cell addresses.

In a memory characterized by a large number of free and available memory addresses for write, and long idle time periods compared to run time periods, it may be advantageous to employ system visible pre-set cells only. In rare cases, if the memory nevertheless gets filled up and the limit on the available total number of pre-set cells is reached, the data rate just will decrease until there is time and possibility to create new pre-set cells.

In a memory with many read operations per write operation, the benefits with system visible pre-set cells are less evident. In these situations it may be advantageous to design the system such that during an average idle time period system invisible pre-set cells can be distributed evenly, with system visible pre-set cells being created only during extra long idle term. Typically a memory with few writes, e.g. a long time storage memory, has high probability of occupying a large amount of the total memory, and relying on system visible pre-set cells only may not be a good idea, or at least the minimum allowed value for remaining total number of pre-set cells should be set fairly high. In such a long time storage device, the method of the present invention can be used to increase the overall data rate during average use and further increase write speed in situations with significant amounts of free memory that facilitate possibility to build up a buffer of pre-set cells to use for fast write operations.

The present invention teaches two basic approaches to device optimization as regards creation and distribution of system visible, respectively system invisible pre-set cells:

i) In this case, the future use pattern of the device is well known or at least constrained within a certain envelope which permits optimized procedures for handling of system visible and system invisible pre-set cells, as well as possible allowed limits on the number of total available pre-set cells, to be defined and programmed into the device from the start. The start might be at fabrication or at the point of first use, installation or re-installation, or at any other re-configurative occasion of the device.

ii) In this case, the future use pattern of the device is unknown or may vary over time. This is handled by making the device automatically adaptable: The use pattern of the device is monitored and the pre-set cells are configured according to an optimization algorithm programmed into the device.

When a device that implements the method of the invention is fabricated, all memory cells will typically be set to the same polarization state. However, which cells that are to be system visible and system invisible, the numbers thereof, the specific mode of operation to be used etc, need not be configured and set up at the same time, even though it is possible. Instead the configuration of the device may be done at a later stage, e.g. when first using or installing the device, or it may be user initiated after installation.

Advantages of the method according to the invention include enabling a general increase of data rate by providing sufficient settle times in switched memory cells without the need for routinely introducing delays between operations and voltage pulses.

Further advantages of the method according to the present invention have been mentioned in connection with previous discussions of preferred embodiments. However, in particular the following point should be emphasized:

Memory cell accesses will be distributed among the segments, which in turn will increase the time until a cell reaches the critical number of switches due to fatigue.

Up to twice the data rate for write operations by utilizing system visible pre-set cells.

All features and steps of the preferred embodiments disclosed herein and in the accompanying claims and figures may be combined in any relationship except when such features/steps are mutually exclusive or may not be applied concurrently or in connection with each other. The preferred embodiments must be considered exemplary of the generic and principle aspects of the method according to the present invention. Hence any parts of given examples, presented embodiments, described features and steps thereof may be replaced by alternatives serving the same, equivalent or similar purpose.

The invention claimed is:

1. A method for reducing detrimental phenomena related to disturb voltages in a data storage apparatus employing passive matrix-addressing, wherein the data storage apparatus comprises a plurality of data storage cells for storing logical values as given by a specific charge value set in each cell, wherein each of the data storage cells comprises an electrically polarizable memory material exhibiting hysteresis, wherein the cells are physically disposed in one or more matrices, each of said matrices providing passive matrix addressability to the cells and each of the matrices comprising a first and a second electrode set, wherein the electrodes of each set provided in parallel, one set of electrodes forming word lines and the other set forming bit lines, wherein the word line electrodes and the bit line electrodes are provided crossing each other and in direct or indirect contact with the memory material, the data storage cells of the apparatus realized as capacitor-like elements defined in a volume of the memory material between or at the crossings of word lines and bit lines and settable to either of at least two polarization states by applying an active voltage pulse of a voltage $V_S$ larger than a coercive voltage $V_C$ corresponding to a coercive electric field of the memory material, between a word line and a bit line and over the data storage cell defined therebetween, wherein an application of electric potentials conforms to an addressing operation, and wherein the electric potentials applied to all word and bit lines in the addressing operation are controlled in a time-coordinated manner according to a predetermined voltage pulse protocol, wherein the data storage cells of the data storage apparatus are provided in two or more electrically separated segments, each segment comprising a separate physical address space of the data storage apparatus the method comprising:

setting in a first addressing operation constituting a first part of an addressing cycle one or more addressed data storage cells in one of the segments to a first polarization state by means of a first active voltage pulse in the first addressing operation, during which each bit line dependent on the voltage pulse protocol can be connected with a sensing means for detecting the polarization state of the data storage cell at least under a part of the duration of the first active voltage pulse;

applying to the one or more addressed data storage cells in the one segment dependent on the voltage pulse protocol a second voltage pulse, which can be a second active voltage pulse of opposite polarity to that of the first active voltage pulse and switching the addressed data storage cell from the first polarization state to a second polarization state, such that each cell being addressed is set to a predetermined polarization state as specified by the first addressing operation;

applying in a second addressing operation the second voltage pulse to one or more data storage cells in another segment, such that one or more data storage cells in the another segment are preset to either the first polarization state or the second polarization state; and dependent on the addressing operation to be carried out, storing information in said one or more preset data storage cells in said another segment after an active voltage pulse with the same polarity has been applied thereto, said another segment being selected for the second addressing operation on the basis of prior and/or scheduled application of active voltage pulses to said two or more electrically separated segments.

2. The method according to claim 1, further comprising:
storing information on the pre-set polarization state with reference to the physical address of the cell.

3. The method according to claim 1, further comprising:
retrieving the stored information on the polarization state prior to subjecting a cell to the second voltage pulse.

4. The method according to claim 3, wherein
the optional second active voltage pulse is applied with opposite polarity to the first active voltage pulse if the pre-set polarization corresponds to the first polarization state, and
the optional second active voltage pulse is applied with same polarity as the first active voltage pulse if the pre-set polarization corresponds to the second polarization state.

5. The method according to claim 1, further comprising:
removing the stored information on the cell being pre-set to a polarization state after subjecting each of the pre-set cells at the address to the second voltage pulse.

6. The method according to claim 1, further comprising:
storing information on the total number of pre-set cells.

7. The method according to claim 1, further comprising:
directing data in an addressing operation to the segment with the longest time since last being subjected to an active voltage pulse.

8. The method according to claim 7, further comprising:
using a queue;
putting a reference to the segment most recently subjected to an active voltage pulse last in the queue; and
retrieving a reference to the segment with the longest time since being subjected to an active pulse from a first position in the queue.

9. The method according to claim 8, further comprising:
storing references to each of the segments in a "segment table" with additional information connected to each of the references.

10. The method according to claim 9, wherein
the additional information comprises at least one of number of addresses with pre-set cells in the referenced segment, timestamp of last segment access, lock state mark, physical addresses to pre-set cells in the referenced segment, a pre-set polarization state mark connected to each of the physical addresses to pre-set cells.

11. The method according to claim 10, further comprising:
removing the physical address of each cell subjected to the second voltage pulse from the segment table.

12. The method according to claim 10, further comprising:
adding the physical address of each cell subjected to the first active voltage pulse to the segment table.

13. The method according to claim 10, further comprising:
setting the lock state mark of a segment reference in the segment table when the first active voltage pulse or the second voltage pulse is applied to a cell in the segment corresponding to the segment reference.

14. The method according to claim 10, further comprising:
updating the timestamp of last segment access of a segment reference in the segment table when the first active voltage pulse or the second voltage pulse is applied to a cell in the segment corresponding to the segment reference.

15. The method according to claim 10, further comprising:
unsetting the lock state mark of a segment reference in the segment table when the difference between current time and the timestamp of last segment access for the segment reference exceeds a predetermined value.

16. The method according to claim 10, wherein
the first active voltage pulse is not applied until the lock state mark of the segment to be subjected to the first active voltage pulse has been unset, and the second voltage pulse is not applied until the lock state mark of the segment to be subjected to the second voltage pulse has been unset.

17. The method according to claim 1, further comprising:
storing the physical address of each cell subjected to the second voltage pulse with reference to a logical address of the addressing operation.

18. The method according to claim 17, wherein
the physical address is stored with reference to the logical address in an "address mapping table" with address level information connected to each of the physical address entries in the address mapping table.

19. The method according to claim 18, wherein
the address level information is at least one of a pre-set mark, a pre-set polarization state mark, a segment reference.

20. The method according to claim 18, wherein
the address mapping table is stored in a fast access memory other than the data storage apparatus employing passive matrix-addressing.

21. A method according to claim 18, wherein not listing a predetermined number of addresses to pre-set cells are not listed in the address mapping table.

22. The method according to claim 18, further comprising:
retrieving the physical address with the address level information from the address mapping table before applying the first active voltage pulse the second voltage pulse.

23. The method according to claim 22, further comprising:

delaying the second voltage pulse if finding a set pre-set mark.

24. The method according to claim 22, further comprising:
delaying the second addressing operation if the address of the pre-set cells is listed in the address mapping table.

25. The method according to claim 22, further comprising:
delaying the second addressing operation if the total number of pre-set cell addresses are exceeding a predetermined value.

26. The method according to claim 17, further comprising:
storing the logical address in part of the data storage cells at the physical address corresponding to the logical address.

27. The method according to claim 1, further comprising:
distributing addresses whereat each cell is pre-set to the same polarization state among the segments during idle time when no other higher-priority operations are ongoing or imminent in the segments.

28. The method according to claim 27, further comprising:
executing a read with write-back operation in the segment with the least number of pre-set cells.

29. The method according to claim 1, further comprising:
creating cells that are pre-set to the same polarization state at a free address during idle time when no other higher-priority operations are ongoing or imminent in the segments.

30. The method according to claim 29, further comprising:
applying an active voltage pulse of the same polarity to each cell at the free address.

31. The method according to claim 29, wherein
the free address is selected in a segment with the least number of pre-set cells.

32. The method according to claim 1, further comprising:
imposing a delay before applying the first active voltage pulse if the second voltage pulse of a preceding operation, or any of a predetermined number of preceding operations, was applied to the same segment as a current addressing operation.

33. The method according to claim 1, further comprising:
imposing a delay before applying the first active voltage pulse if the difference between current time and the last time the segment was subjected to a first active voltage pulse or a second voltage pulse does not exceed a predetermined value.

34. The method according to claim 1, further comprising:
imposing a delay before applying the second active voltage pulse if the difference between current time and the last time the segment was subjected to a first active voltage pulse or a second voltage pulse, does not exceed a predetermined value.

35. The method according to claim 1, further comprising:
analyzing the consecutive operation or a predetermined number of consecutive operations before executing the current addressing operation.

36. The method according to claim 35, further comprising:
selecting another segment than addressed by the consecutive operation or by a predetermined amount consecutive operations for application of the second voltage pulse of the current addressing operation.

* * * * *